United States Patent
Chiang et al.

(10) Patent No.: US 9,721,829 B2
(45) Date of Patent: *Aug. 1, 2017

(54) FINFETS WITH DIFFERENT FIN HEIGHT AND EPI HEIGHT SETTING

(71) Applicant: Taiwan Semiconductor Manufacturing Company, Ltd., Hsin-Chu (TW)

(72) Inventors: Hung-Li Chiang, Hsin-Chu (TW); Wei-Jen Lai, Keelung (TW); Feng Yuan, Hsin-Chu (TW); Tsung-Lin Lee, Hsin-Chu (TW); Chih Chieh Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/003,909

(22) Filed: Jan. 22, 2016

(65) Prior Publication Data

US 2016/0141205 A1  May 19, 2016

Related U.S. Application Data

(60) Continuation of application No. 14/752,316, filed on Jun. 26, 2015, now Pat. No. 9,257,344, which is a (Continued)

(51) Int. Cl.
*H01L 21/336* (2006.01)
*H01L 21/762* (2006.01)
(Continued)

(52) U.S. Cl.
CPC .. *H01L 21/76224* (2013.01); *H01L 21/28017* (2013.01); *H01L 21/302* (2013.01);
(Continued)

(58) Field of Classification Search
CPC ..... H01L 21/823431; H01L 21/823821; H01L 27/0886
See application file for complete search history.

(56) References Cited

U.S. PATENT DOCUMENTS 6,706,571 B1   3/2004  Yu et al.
6,858,478 B2   2/2005  Chau et al.
(Continued)

FOREIGN PATENT DOCUMENTS

JP   2003298051   10/2003
JP   2005294789   10/2005
(Continued)

*Primary Examiner* — Elias M Ullah
(74) *Attorney, Agent, or Firm* — Slater Matsil, LLP

(57) ABSTRACT

An integrated circuit structure includes a first semiconductor strip, first isolation regions on opposite sides of the first semiconductor strip, and a first epitaxy strip overlapping the first semiconductor strip. A top portion of the first epitaxy strip is over a first top surface of the first isolation regions. The structure further includes a second semiconductor strip, wherein the first and the second semiconductor strips are formed of the same semiconductor material. Second isolation regions are on opposite sides of the second semiconductor strip. A second epitaxy strip overlaps the second semiconductor strip. A top portion of the second epitaxy strip is over a second top surface of the second isolation regions. The first epitaxy strip and the second epitaxy strip are formed of different semiconductor materials. A bottom surface of the first epitaxy strip is lower than a bottom surface of the second epitaxy strip.

20 Claims, 31 Drawing Sheets

Related U.S. Application Data division of application No. 14/277,160, filed on May 14, 2014, now Pat. No. 9,087,725, which is a continuation-in-part of application No. 14/046,188, filed on Oct. 4, 2013, now Pat. No. 8,748,993, which is a continuation of application No. 13/764,549, filed on Feb. 11, 2013, now Pat. No. 8,673,709, which is a division of application No. 12/843,595, filed on Jul. 26, 2010, now Pat. No. 8,373,238.

(60) Provisional application No. 61/266,427, filed on Dec. 3, 2009.

(51) Int. Cl.

| | | |
|---|---|---|
| *H01L 27/092* | (2006.01) | |
| *H01L 21/8234* | (2006.01) | |
| *H01L 29/06* | (2006.01) | |
| *H01L 29/66* | (2006.01) | |
| *H01L 21/76* | (2006.01) | |
| *H01L 29/78* | (2006.01) | |
| *H01L 27/088* | (2006.01) | |
| *H01L 21/8238* | (2006.01) | |
| *H01L 21/302* | (2006.01) | |
| *H01L 21/311* | (2006.01) | |
| *H01L 21/28* | (2006.01) | |
| *H01L 21/306* | (2006.01) | |

(52) U.S. Cl.
CPC .. *H01L 21/30604* (2013.01); *H01L 21/31144* (2013.01); *H01L 21/76* (2013.01); *H01L 21/76229* (2013.01); *H01L 21/76232* (2013.01); *H01L 21/823431* (2013.01); *H01L 21/823437* (2013.01); *H01L 21/823481* (2013.01); *H01L 21/823821* (2013.01); *H01L 27/0886* (2013.01); *H01L 27/0924* (2013.01); *H01L 29/0649* (2013.01); *H01L 29/66666* (2013.01); *H01L 29/66795* (2013.01); *H01L 29/785* (2013.01)

(56) References Cited

U.S. PATENT DOCUMENTS

| | | | |
|---|---|---|---|
| 7,190,050 B2 | 3/2007 | King et al. | |
| 7,214,576 B1 | 5/2007 | Kaneko et al. | |
| 7,247,887 B2 | 7/2007 | King et al. | |
| 7,265,008 B2 | 9/2007 | King et al. | |
| 7,314,787 B2 | 1/2008 | Yagishita | |
| 7,508,031 B2 | 3/2009 | Liu et al. | |
| 7,528,465 B2 | 5/2009 | King et al. | |
| 7,605,449 B2 | 10/2009 | Liu et al. | |
| 8,373,238 B2 | 2/2013 | Lee et al. | |
| 9,257,344 B2 * | 2/2016 | Chiang | H01L 21/76 |
| 2005/0153490 A1 | 7/2005 | Yoon et al. | |
| 2006/0057792 A1 | 3/2006 | Mathew et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0221956 A1 | 9/2007 | Inaba | |
| 2008/0157225 A1 | 7/2008 | Datta et al. | |
| 2008/0290470 A1 | 11/2008 | King et al. | |
| 2008/0296632 A1 | 12/2008 | Moroz et al. | |
| 2009/0181477 A1 | 7/2009 | King et al. | |

FOREIGN PATENT DOCUMENTS

| | | |
|---|---|---|
| JP | 2007073831 | 3/2007 |
| JP | 2009087982 | 4/2009 |

* cited by examiner

FINFETS WITH DIFFERENT FIN HEIGHT AND EPI HEIGHT SETTING

PRIORITY CLAIM AND CROSS-REFERENCE

This application is a continuation of U.S. patent application Ser. No. 14/752,316, filed Jun. 26, 2015, which application is a divisional U.S. patent application Ser. No. 14/277,160, filed on May 14, 2014 which application is a continuation-in-part of U.S. application Ser. No. 14/046,188, filed on Oct. 4, 2013 now U.S. Pat. No. 8,748,993 which is a continuation of U.S. application Ser. No. 13/764,549, filed on Feb. 11, 2013 now U.S. Pat. No. 8,673,709 which is further a divisional of U.S. patent application Ser. No. 12/843,595, filed Jul. 26, 2010 now U.S. Pat. No. 8,373,238, which application further claims the benefit of U.S. Provisional Application No. 61/266,427 filed on Dec. 3, 2009, which applications are hereby incorporated herein by reference.

BACKGROUND

With the increasing down-scaling of integrated circuits and increasingly demanding requirements for higher speed of integrated circuits, transistors need to have higher drive currents with increasingly smaller dimensions. Fin field-effect transistors (FinFETs) were thus developed. FinFETs have increased channel widths because the channels include sidewall portions in addition to the portions on the top surfaces of the fins. Since the drive currents of transistors are proportional to the channel widths, the drive currents of FinFETs are increased over that of planar transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
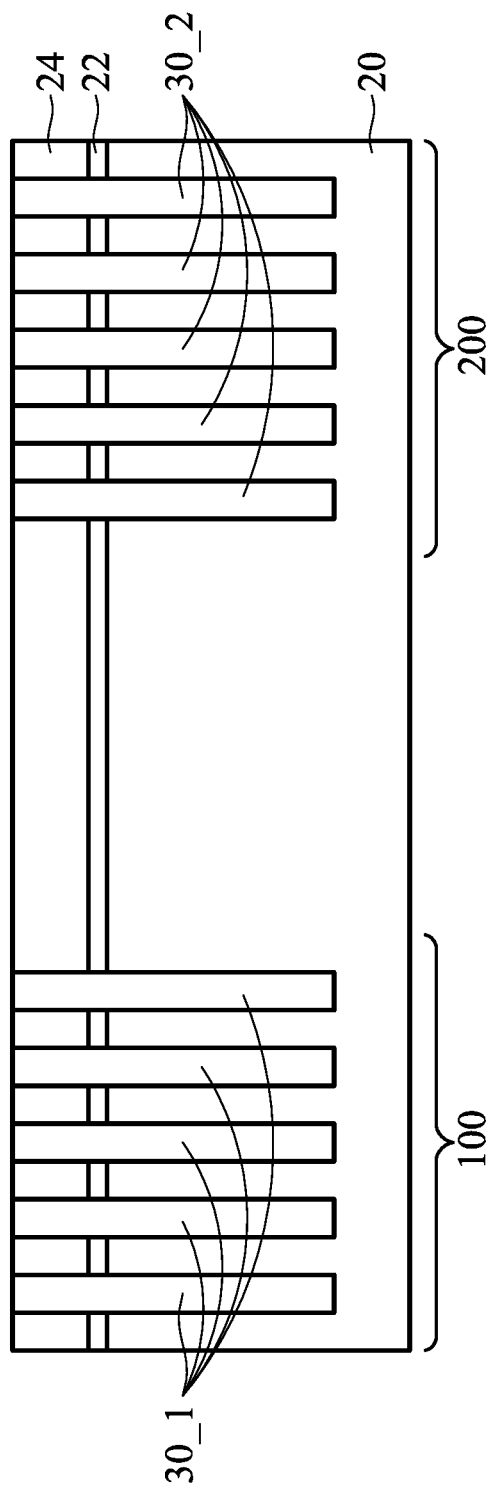
FIGS. 1 through 10 are cross-sectional views of intermediate stages in the manufacturing of semiconductor fins having different fin heights in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for forming semiconductor fin(s) with different fin heights and/or different epitaxy heights and the respective Fin Field-effect Transistor(s) (FinFET(s)) is provided. The intermediate stages in the manufacturing of the FinFETs in accordance with some embodiments are illustrated. The variations of the embodiments are discussed. Throughout the various views and illustrative embodiments, like reference numbers are used to designate like elements.

Referring to FIG. 1, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20.

Figure 17:
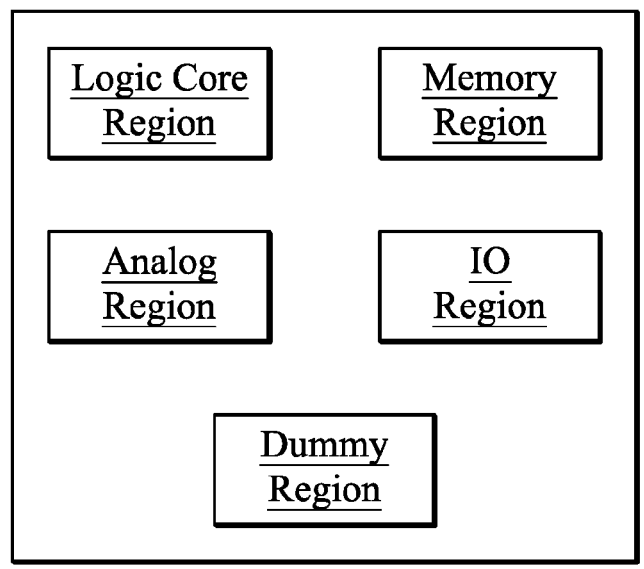
FIG. 17 illustrates device regions in a semiconductor chip.

Semiconductor substrate 20 includes a portion in device region 100 and a portion in device region 200. In an embodiment, device regions 100 and 200 are different regions selected from the group consisting essentially of a logic core region, a memory region (such as an embedded static random access memory (SRAM) region), an analog region, an input/output (TO, also referred to as a peripheral) region, a dummy region (for forming dummy patterns), and the like. The above-referenced device regions are schematically illustrated in FIG. 17. In an exemplary embodiment, device region 100 is a logic core region, while device region 200 is an IO region. In alternative embodiments, device region 100 is a p-type FinFET region, while device region 200 is an n-type FinFET region.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes.

STI regions 30 (denoted as 30-1 and 30-2) are formed in semiconductor substrate 20. The depth of STI regions 30 may be between about 100 nm and about 250 nm, although different depths are also applicable. It is realized, however, that the dimensions recited throughout the description are merely examples, and may be changed if different formation technologies are used. The formation of STI regions 30 may be performed using known methods, and hence the process details are not described in detail herein.

Figure 2:
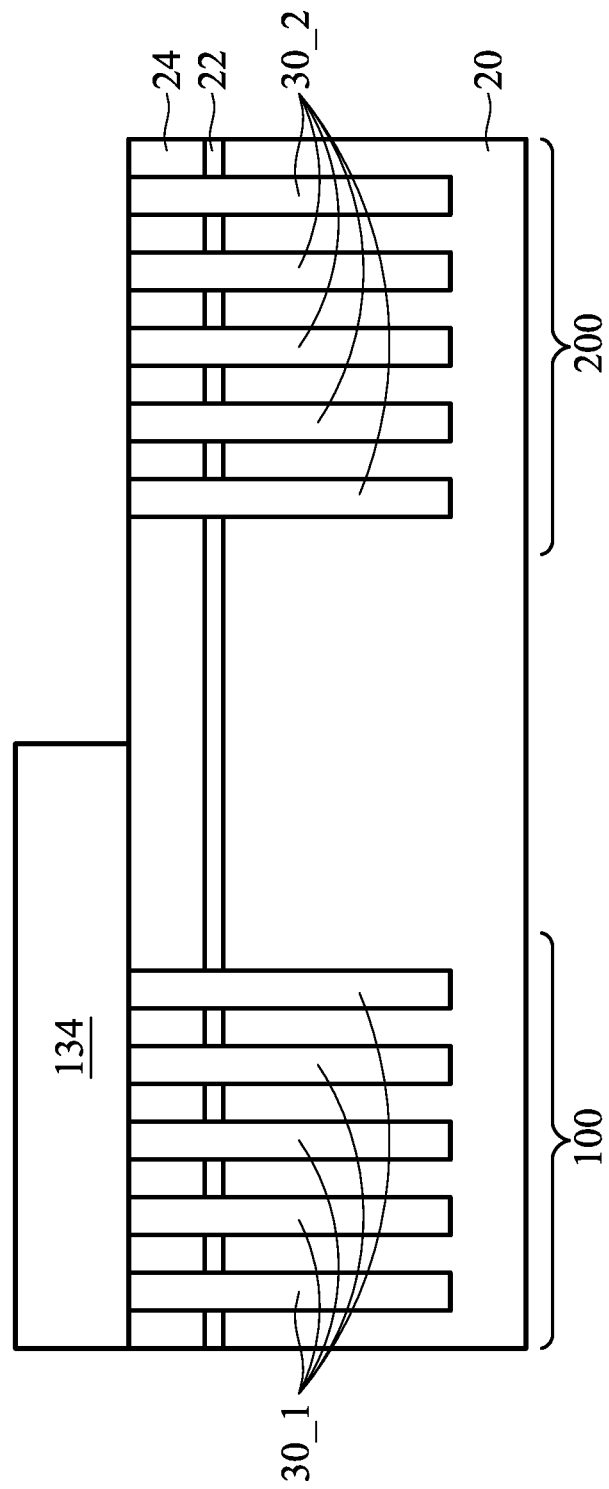
Figure 3:
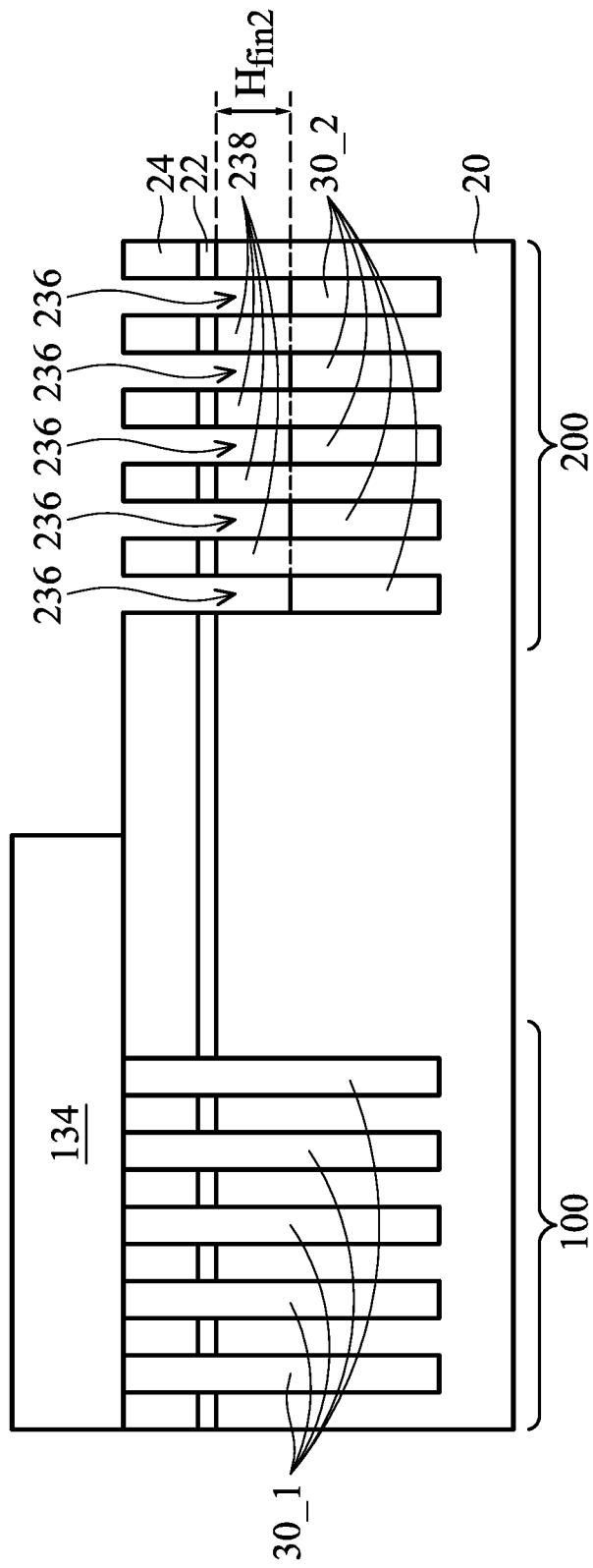

Referring to FIG. 2, device region 100 is masked by photo resist 134, leaving device region 200 exposed. The exposed STI regions 30-2 are then recessed through an etching step, resulting in recesses 236 in semiconductor substrate 20. The resulting structure is shown in FIG. 3. The portions of semiconductor substrate 20 between recesses 236 thus become fins 238, which has a fin height denoted as Hfin2. In an exemplary embodiment, fin height Hfin2 is between about 15 nm and about 30 nm, although it may also be greater or smaller. Photo resist 134 is then removed.

Figure 4:
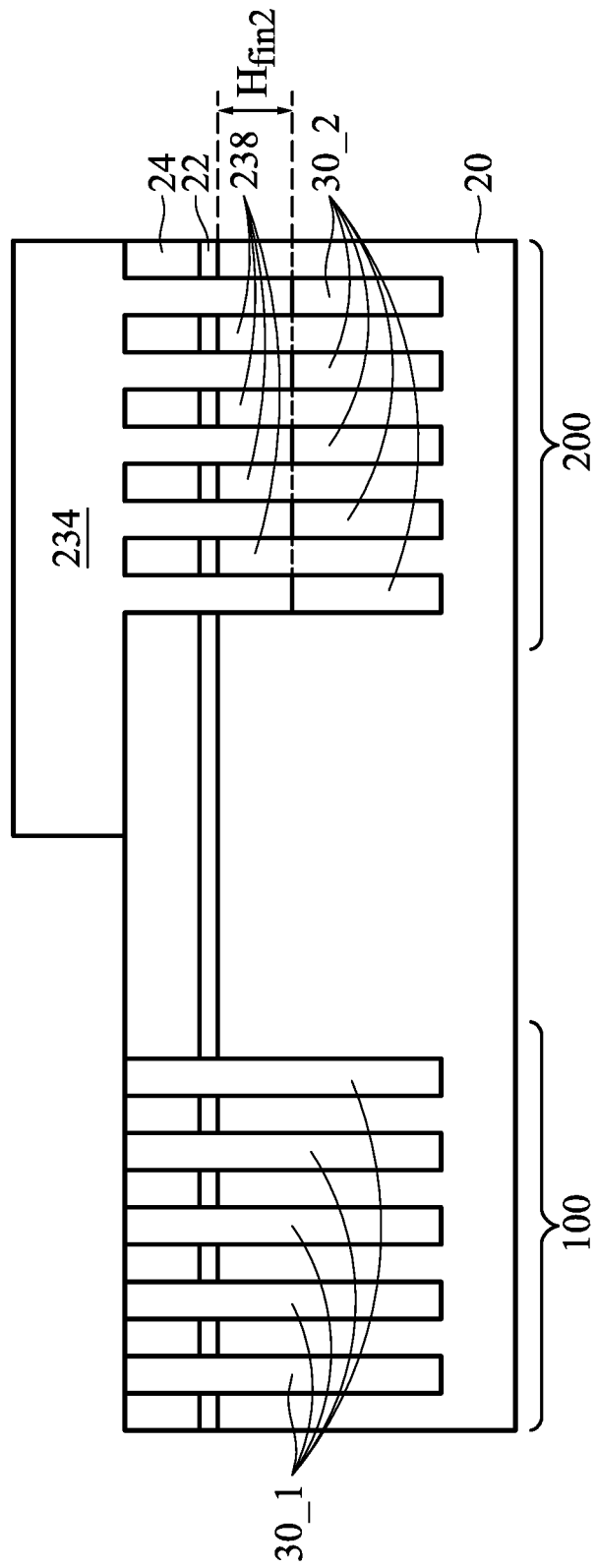
Figure 5:
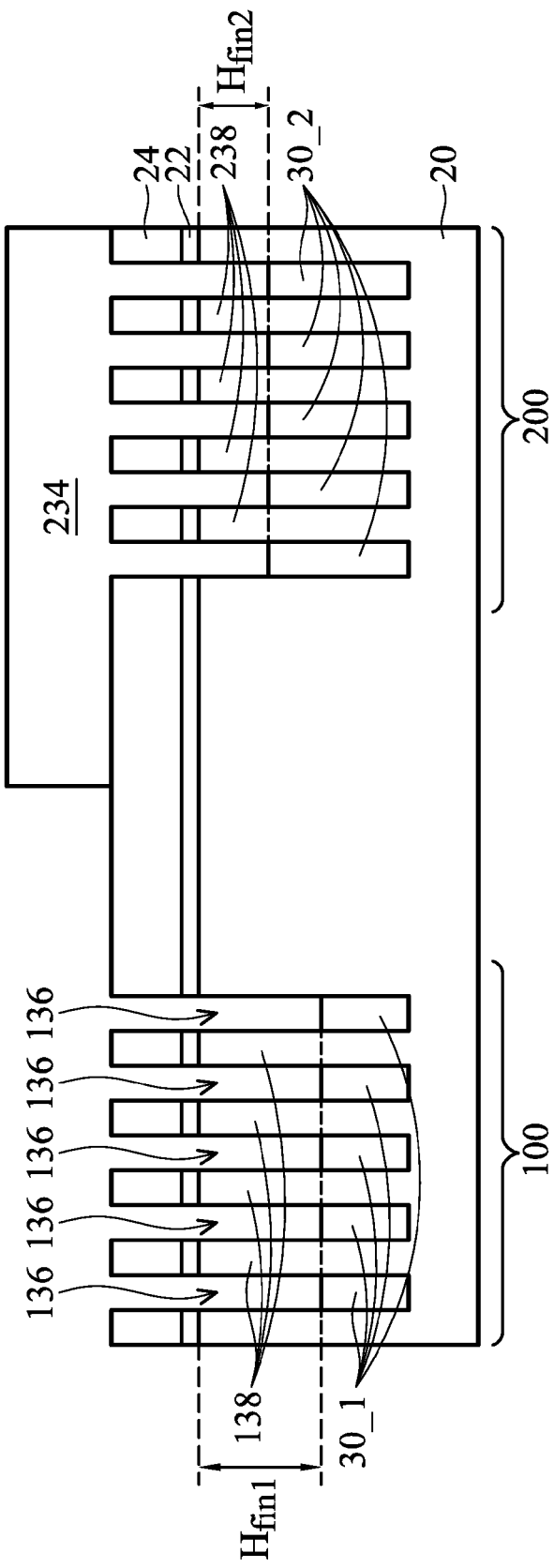

Referring to FIG. 4, device region 200 is masked by photo resist 234, leaving device region 100 exposed. The exposed STI regions 30-1 are then recessed through an etching step, resulting in recesses 136, as is shown in FIG. 5. The portions of semiconductor substrate 20 between recesses 136 thus become fins 138, which has a fin height denoted as Hfin1. In an exemplary embodiment, fin height Hfin1 is between about 25 nm and about 40 nm, although it may also be greater or smaller. Fin heights Hfin1 and Hfin2 are different from each other. The fin height difference (Hfin2−Hfin1) may be greater than about 5 nm, or even greater than about 10 nm. Further, a ratio of Hfin1/Hfin2 may be greater than about 1.25, or even greater than about 1.33.

Figure 6:
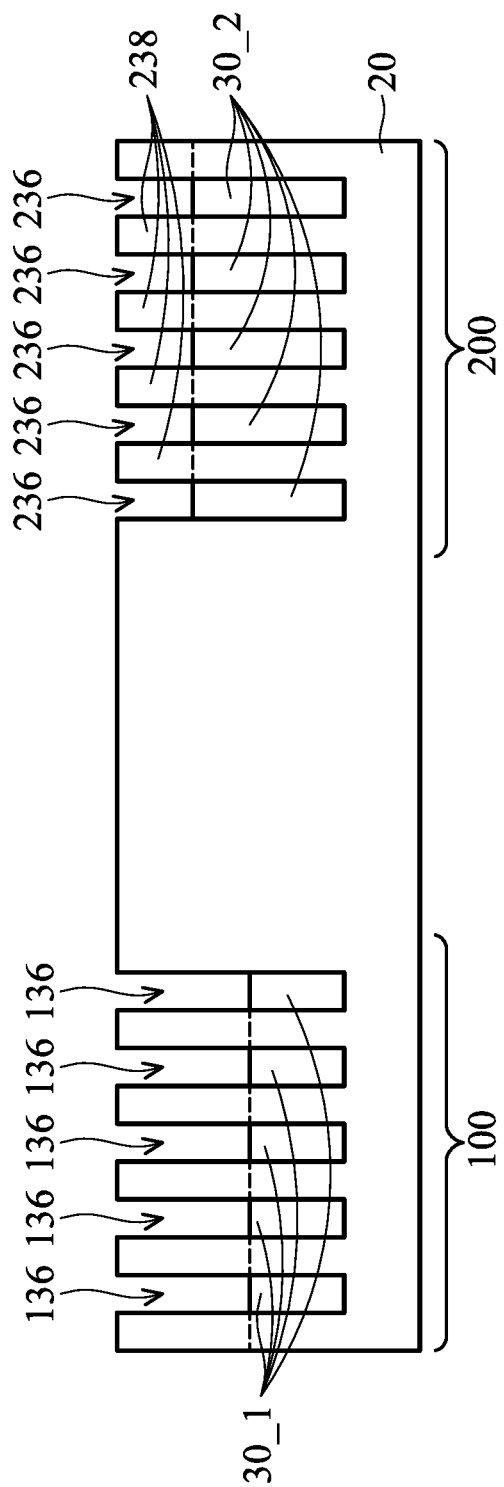

Next, as shown in FIG. 6, mask layer 24 and pad layer 22 are removed. Mask layer 24, if formed of silicon nitride, may be removed by a wet process using hot H3PO4, while pad layer 22 may be removed using diluted HF acid, if formed of silicon oxide. It is noted that in the structure shown in FIG. 6, the portion of substrate 20 below the bottoms of STI regions 30 may be treated as a semiconductor substrate, while fins 138 and 238 may be treated as being over the semiconductor substrate.

Figure 7:
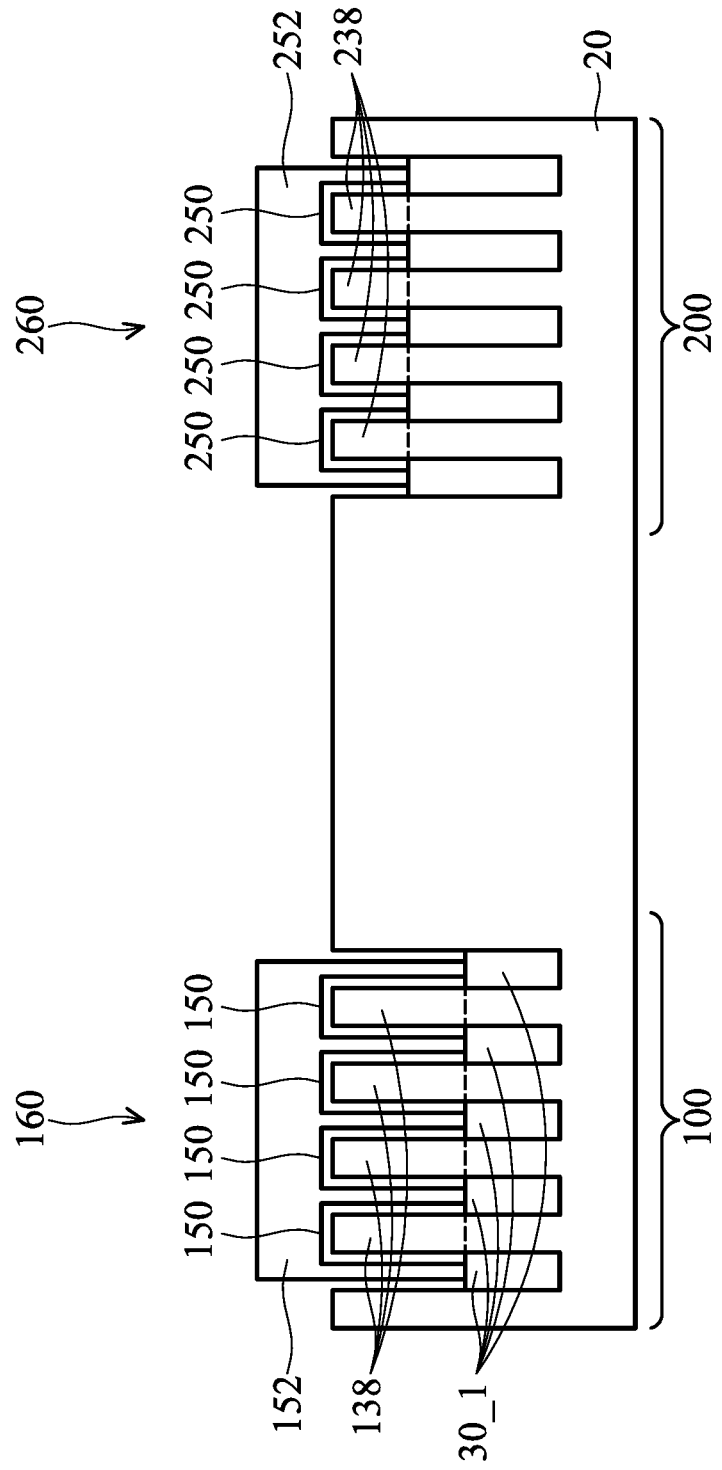

FIG. 7 illustrates the formation of FinFETs 160 and 260 in device regions 100 and 200, respectively. First, well dopants are introduced into the exposed fins 138 and 238, for example, by implantations. In the embodiment in which device region 100 is a p-type FinFET region and device region 200 is an n-type FinFET region, an n-type impurity implantation is performed to dope an n-type impurity such as phosphorous into fins 138, and a p-type impurity implantation is performed to dope a p-type impurity such as boron into fins 238. For simplicity, the masks used for doping the wells are not shown. Gate dielectrics 150 and 250 are formed to cover the top surface and sidewalls of fins 138 and 238, respectively. Gate dielectrics 150 and 250 may be formed by thermal oxidation, and hence may include thermal silicon oxide. Gate electrodes 152 and 252 are then formed on gate dielectrics 150 and 250, respectively. In an embodiment, each of gate electrodes 152 and 252 covers more than one of fins 138 and 238, so that each of the resulting FinFETs 160 and 260 comprises more than one fin 138 and 238, respectively. In alternative embodiments, each of fins 138 and/or 238 may be used to form one FinFET. The remaining components of FinFETs 160 and 260, including source and drain regions and source and drain silicides (not shown), are then formed. The formation processes of these components are known in the art, and hence are not repeated herein.

Figure 8:
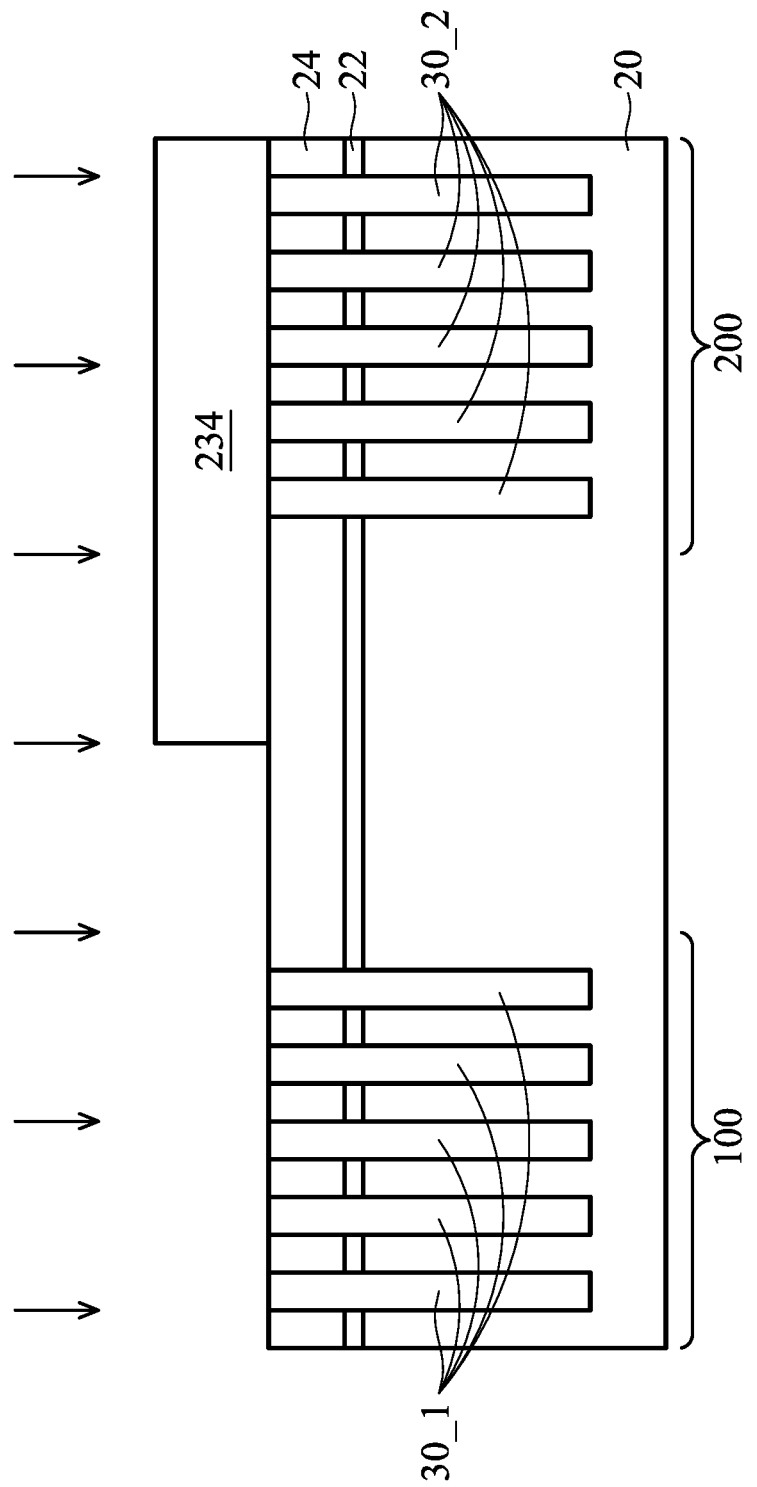
Figure 9:
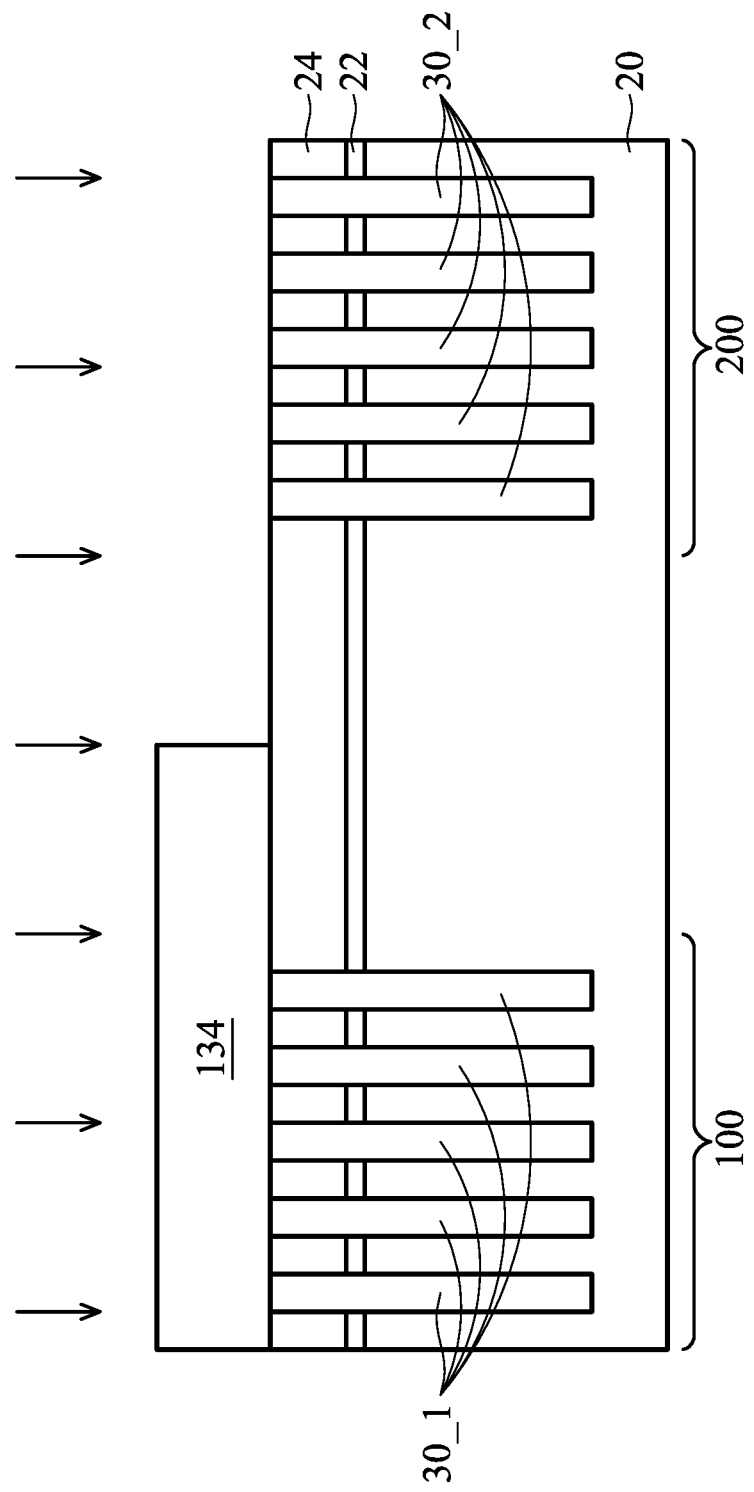
Figure 10:
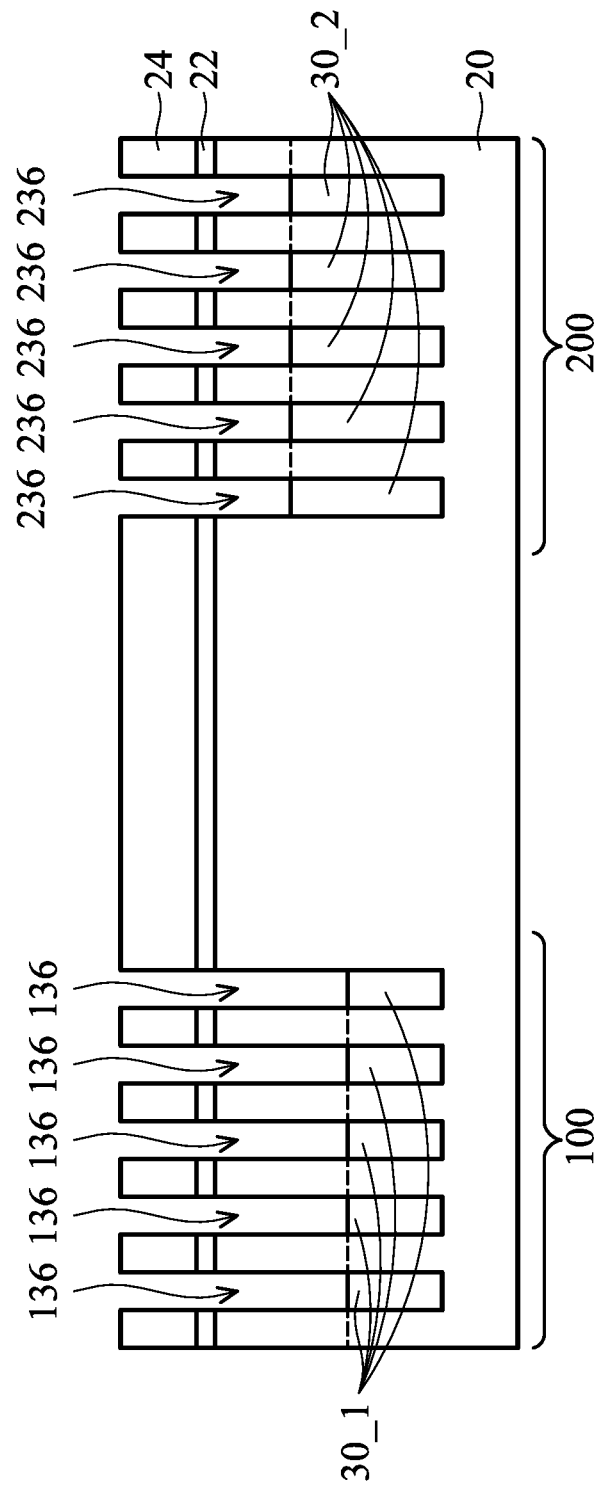

FIGS. 8 through 10 illustrate an alternative embodiment. The initial structure used in this embodiment is similar to what is shown in FIG. 1. Next, referring to FIG. 8, after the formation of photo resist 234 for device region 200, a first implantation is performed with a first dosage to introduce a first impurity into STI regions 30-1. The resulting STI regions 30-1 have a first impurity concentration. Next, as shown in FIG. 9, photo resist 234 is removed, and photo resist 134 is formed. A second implantation is performed with a second dosage to introduce a second impurity into STI regions 30-2. The resulting STI regions have a second impurity concentration. In an exemplary embodiment, the first impurity includes phosphorous, while the second impurity includes boron.

Next, as shown in FIG. 10, photo resist 134 is removed, and STI regions 30 are recessed, for example, using a wet etch or other methods. Due to the different impurity concentrations in STI regions 30-1 and 30-2, the etching rates of STI regions 30-1 and 30-2 are different, and hence the resulting fin heights Hfin1 and Hfin2 are different. The difference in fin heights Hfin1 and Hfin2 may be further increased by making the pattern density of STI regions 30-1 different from the pattern density of STI regions 30-2 in order to introduce a pattern-loading effect, so that the difference in etching rates of STI regions 30-1 and 30-2 is further increased. In alternative embodiments, no STI doping as shown in FIGS. 8 and 9 are performed. However, the pattern density of STI regions 30-1 is different from that of STI regions 30-2, and the pattern-loading effect is used to result in the fin height difference.

In subsequent steps, mask layer 24 and pad layer 22 are removed, resulting in the structure shown in FIG. 6. Processes are then continued to form FinFETs 160 and 260, as shown in FIG. 7.

Figure 18:
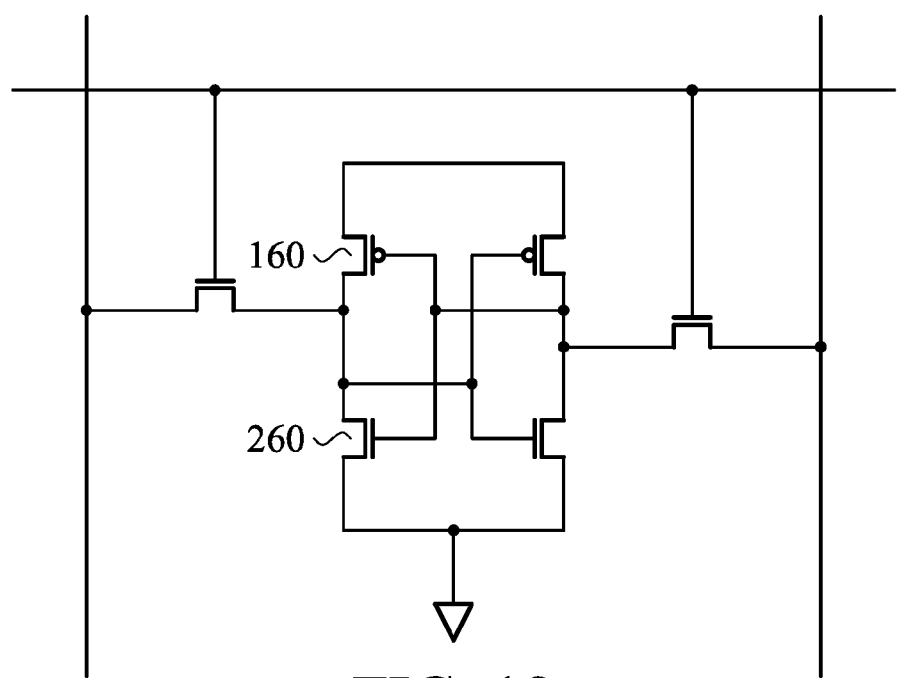
FIG. 18 illustrates a static random access memory including two FinFETs with fins having different fin heights.

By differentiating fin heights in different device regions, the junction window is increased, which means that the fin heights of FinFETs in different device regions are no longer tied together. With the FinFETs in different device regions having different fin heights, it is easier to tune the performance of devices in different device regions. Further, in the embodiment wherein FinFET 160 (FIG. 7) in device region 100 is a p-type FinFET and FinFET 260 in device region 200 is an n-type FinFET, the resulting fin height of p-type FinFET 160 is greater than the fin height of n-type FinFET 260. Accordingly, p-type FinFET 160 and n-type FinFET 260 may be used in a same SRAM cell (FIG. 18). For example, p-type FinFET 160 may be a pull-up transistor, and n-type FinFET 260 may be a pull-down transistor. The greater fin height Hfin1 of p-type FinFET 160 may compensate for the lower hole mobility compared to the higher electron mobility of n-type FinFET 260. The performance of p-type FinFET 160 and the performance of n-type FinFET 260 may thus be balanced.

Figure 11A:
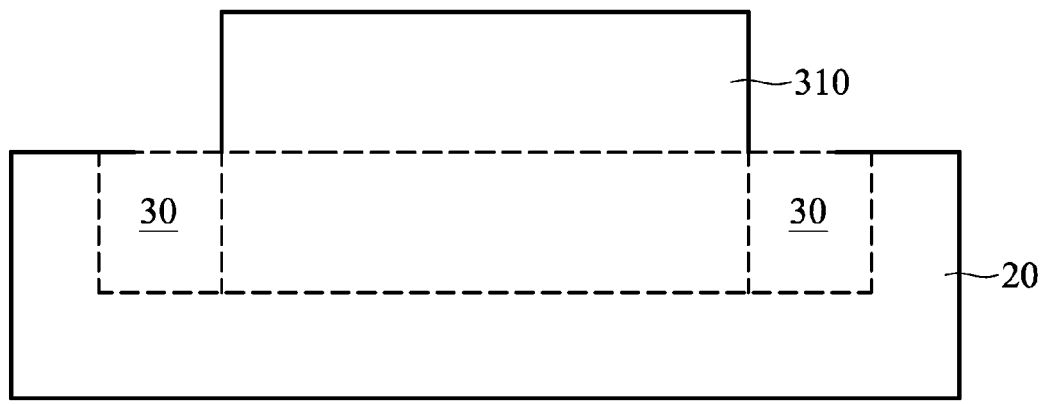
FIGS. 11A through 16B are cross-sectional views and perspective views of intermediate stages in the manufacturing of a FinFET in accordance with another embodiment.

FIGS. 11A through 16B illustrate intermediate stages in the manufacturing of a FinFET in accordance with yet another embodiment, wherein the difference in the recessing depths of STI regions 30 are applied to a single FinFET. First, referring to FIGS. 11A and 11B, semiconductor fin 310, which may be a silicon fin formed of the same material as the underlying semiconductor substrate 20, is formed. The formation of semiconductor fin 310 may be essentially the same as the formation of fins 138 or 238 in FIGS. 2 through 6. FIG. 11A illustrates a lengthwise cross-section view, wherein the dotted lines indicate that semiconductor fin 310 and semiconductor substrate 20 are connected through a semiconductor strip. FIG. 11B illustrates a widthwise cross-sectional view. The fin height of semiconductor fin 310 is Hfin, and the fin width of semiconductor fin 310 is Wfin.

Figure 12:
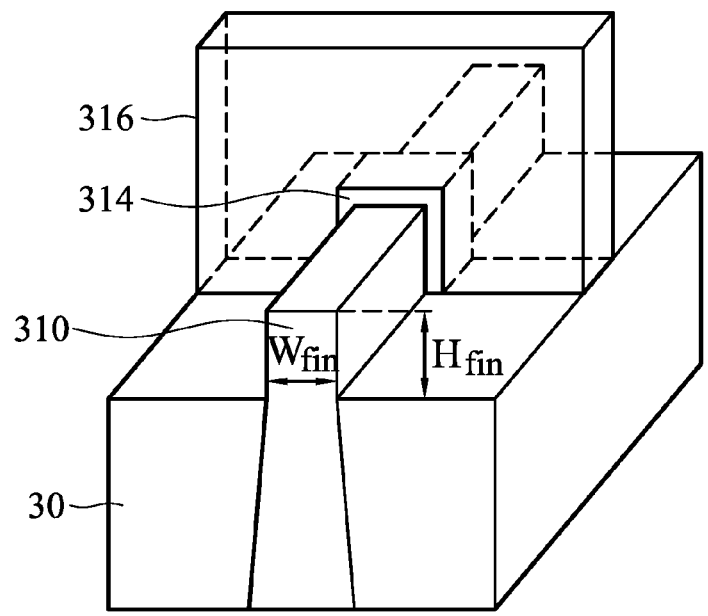
Figure 13:
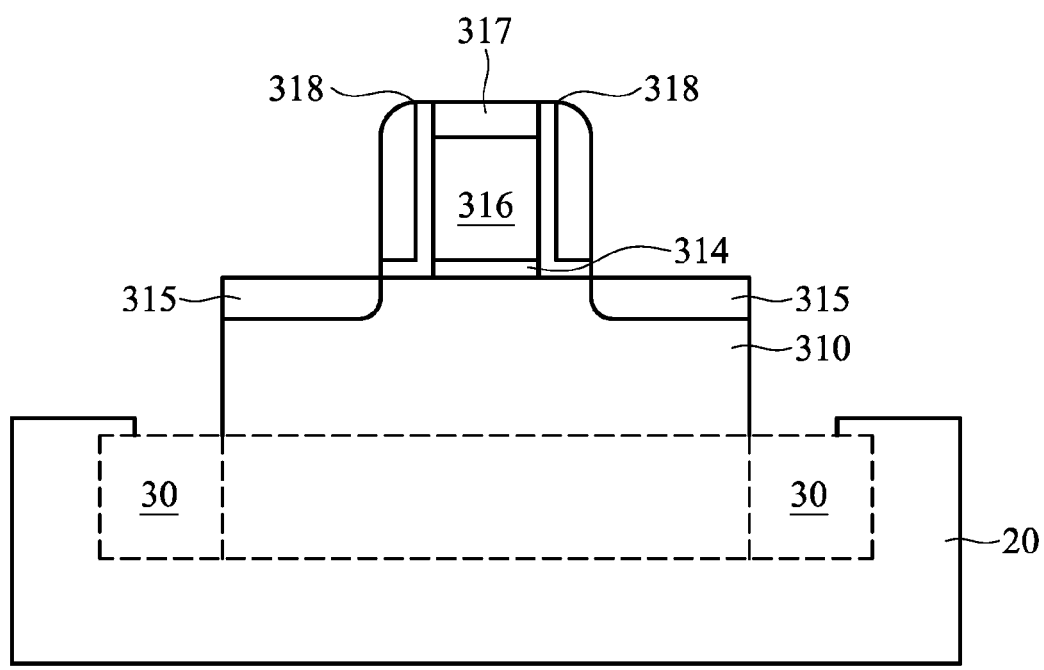

Next, as shown in FIG. 12, which is a perspective view, gate dielectric 314 and gate electrode 316 are formed. Gate dielectric 314 is formed on the top surface and sidewalls of semiconductor fin 310. Gate electrode 316 is formed on gate dielectric 314. Lightly doped source and drain (LDD) regions (not shown) may then be formed by implanting semiconductor fin 310. In an embodiment, slim spacers 318 as shown in FIG. 13 may be formed on the sidewalls of gate dielectric 314 and gate electrode 316, wherein LDD regions may be formed before or after the formation of slim spacers 318. Optionally, mask layer 317, which may be formed of a nitride, is formed. FIG. 13 also illustrates mask layer 317.

Figure 11B:
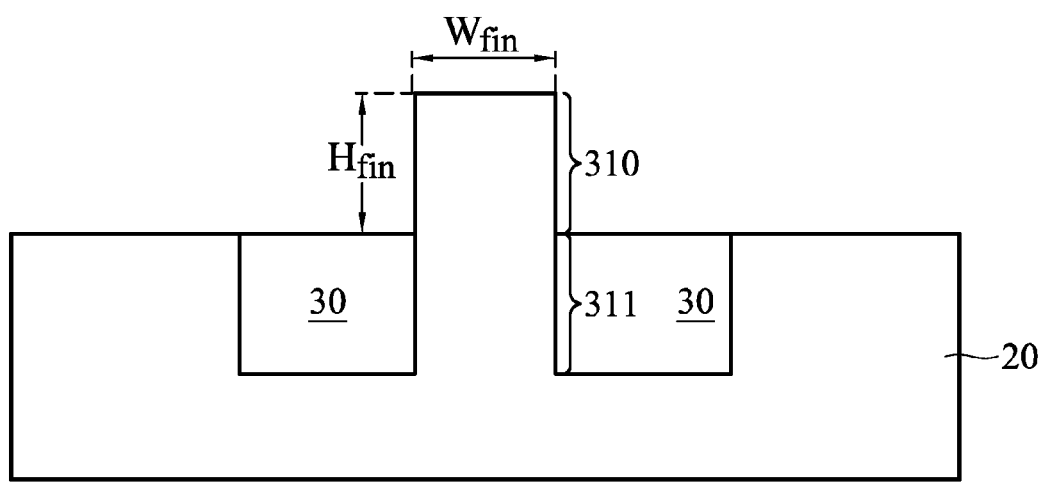
Figure 14A:
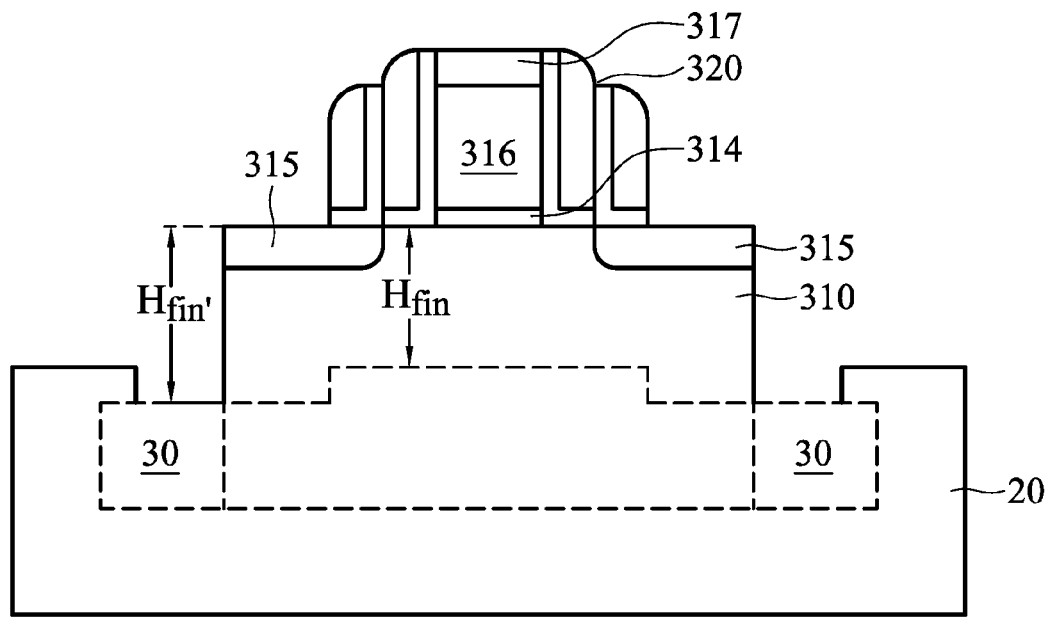
Figure 14B:
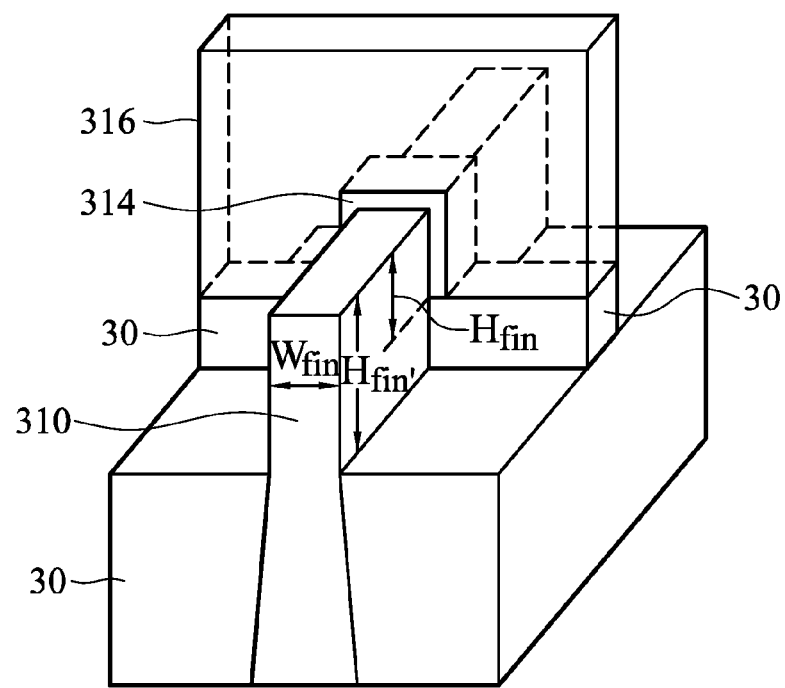

Next, as shown in FIG. 14A, gate spacers 320 are formed. Gate spacers 320 may include the previously formed slim spacers 318. It is realized that gate spacers 320 may have many different variations. For example, as shown in FIG. 14A, each gate spacer 320 may have a nitride-oxide-nitride-oxide (NONO structure). In alternative embodiments, each gate spacer 320 may only have a nitride layer on an oxide layer (referred to as an NO structure). The exposed portions of STI regions on opposite sidewalls of semiconductor fin 310 that is not covered by gate electrode 316 are recessed. A perspective view of the structure shown in FIG. 14A is shown in FIG. 14B. To clearly illustrate the heights of semiconductor fin 310, gate spacers 320 are not shown. In the resulting structure, semiconductor fin 310 has two heights. The portion of semiconductor fin 310 (which also includes the channel region of the resulting FinFET) covered by gate spacers 320 and gate electrode 316 has fin height Hfin, which fin height is the same as shown in FIG. 11B. As the result of the recessing of STI regions 30, the portions of semiconductor fin 310 that are not covered have an increased fin height Hfin'. In an embodiment, Hfin' is greater than fin height Hfin by greater than about 2 nm, or even greater than about 10 nm. Alternatively, a ratio Hfin'/Hfin may be greater than about 1.05, and may even be greater than about 1.08, or between about 1.05 and about 1.5.

Figure 15A:
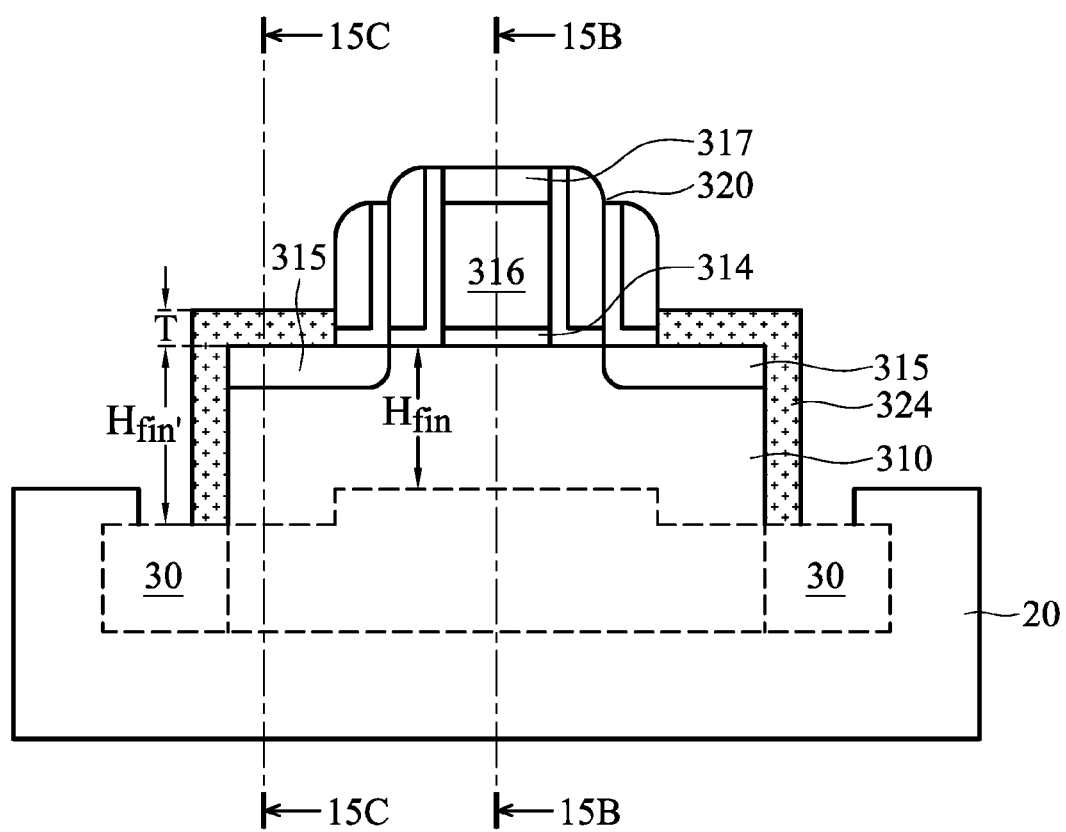

Next, as shown in FIG. 15A, epitaxial semiconductor layers 324 are epitaxially grown on the exposed portions of semiconductor fin 310. Epitaxial semiconductor layers 324 may comprise silicon, germanium, carbon, and/or other known semiconductor materials. In an embodiment wherein the resulting FinFET is of p-type, epitaxial semiconductor layers 324 may comprise silicon and possibly germanium in addition to silicon. In alternative embodiments wherein the resulting FinFET is of n-type, epitaxial semiconductor layers 324 may comprise silicon and possibly carbon in addition to silicon. Thickness T of epitaxial semiconductor layers 324 may be greater than about 10 nm.

Figure 15B:
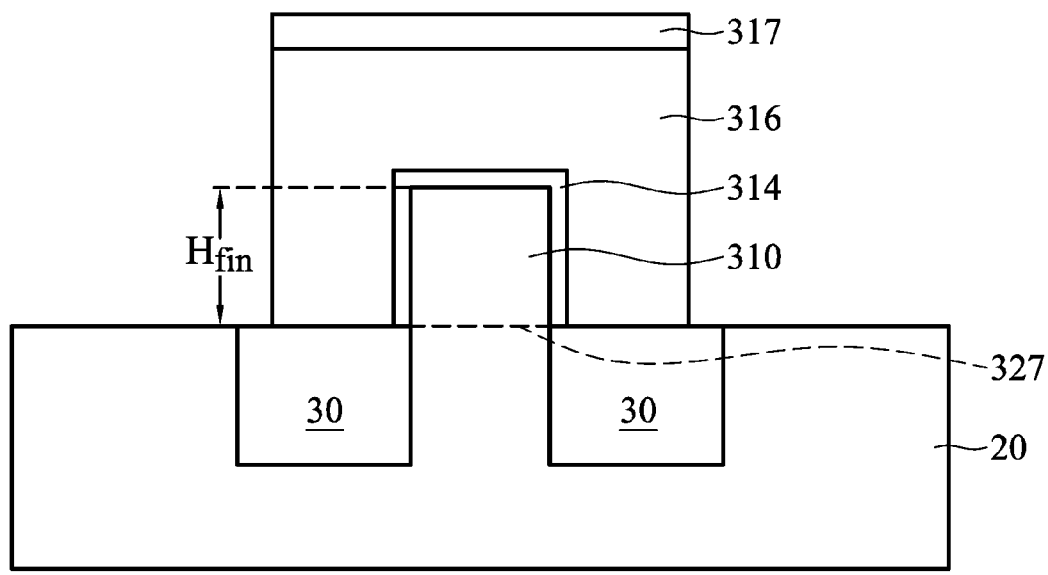
Figure 15C:
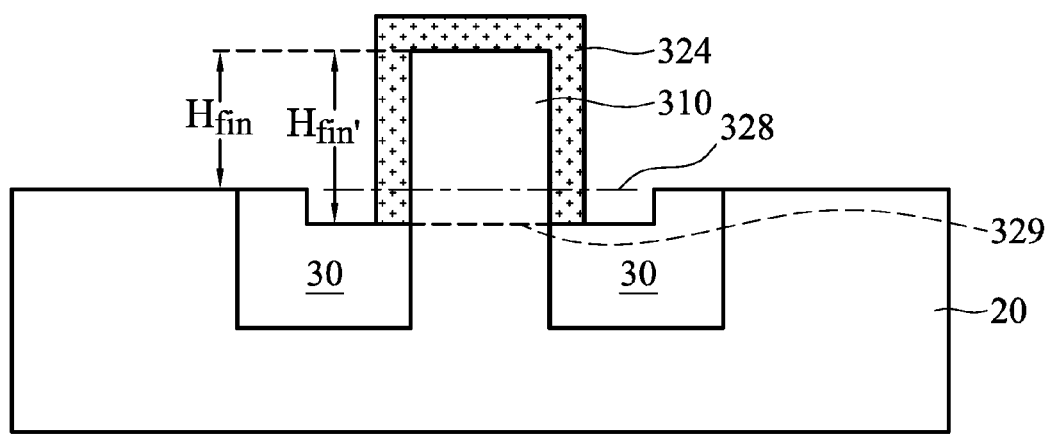

FIG. 15B illustrates an additional cross-sectional view of the structure shown in FIG. 15A, wherein the cross-sectional view is obtained from the vertical plane crossing line 15B-15B in FIG. 15A. Fin height Hfin is marked in FIG. 15B. FIG. 15C illustrates an additional cross-sectional view of the structure shown in FIG. 15A, wherein the cross-sectional view is obtained from the vertical plane crossing line 15C-15C in FIG. 15A. Fin height Hfin' is marked in FIG. 15C. Comparing FIGS. 15B and 15C, it is observed that due to the increased fin height Hfin', the volume of epitaxial semiconductor layers 324 is increased. If the fin height of semiconductor fin 310 is not increased from value Hfin to value Hfin', epitaxial semiconductor layers 324 would have been limited in the region over dotted line 328. In FIGS. 15B and 15C, although there is no clear visible bottoms, semiconductor fins 310 are considered to have bottoms level with top surfaces of STI regions 30 on opposite sides of respective semiconductor fin portions 310. Accordingly, as shown in FIG. 15B, the bottom of the portion of semiconductor fin 310 directly under electrode 316 illustrated as line 327, and in FIG. 15C, the bottom of the portion of semiconductor fin 310 not covered by gate electrode 316 and gate spacers 320 is illustrated as line 329. Bottom 329 is lower than bottom 327.

Figure 16A:
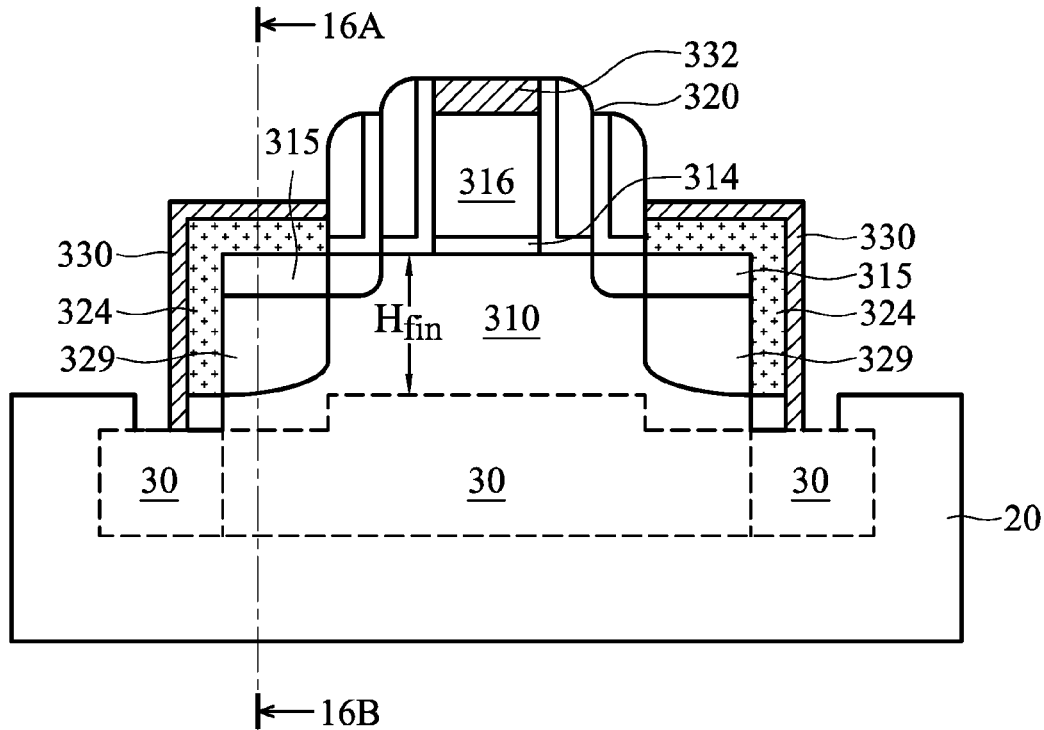

Referring to FIG. 16A, implantations are performed to form source and drain regions (not shown) in semiconductor fin 310 and epitaxial semiconductor layers 324. Mask layer 317 is also removed, and source/drain silicide regions 330 and gate silicide region 332 are formed on epitaxial semiconductor layers 324. The formation of the source and drain regions and silicide regions 330 may adopt known methods. After the formation of silicide regions 330 and 332, epitaxial semiconductor layers 324 may be fully, or partially, consumed. In the resulting structure, silicide regions 330 may be separated from semiconductor fin 310 by remaining portions of epitaxial semiconductor layers 324, or contact semiconductor fin 310 directly.

Figure 16B:
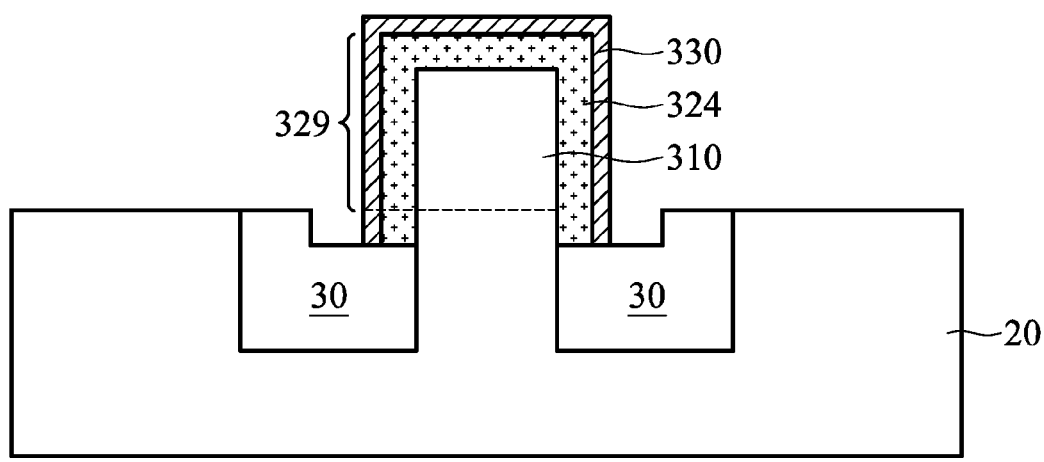

FIG. 16B illustrates an additional cross-sectional view of the structure shown in FIG. 16A, wherein the cross-sectional view is obtained from the vertical plane crossing line 16B-16B in FIG. 16A. It is observed that by recessing STI regions 30 before the epitaxial formation of epitaxial semiconductor layers 324, the volume of the source and drain regions is increased. This has the positive effect of reducing the current crowding in the source and drain regions. The desirable tensile or compressive stress applied to the channel region of the resulting FinFET is also increased due to the increased volume of stressed source and drain regions. In addition, since the size of silicide regions 330 is also increased due to the increased sidewall areas of epitaxial semiconductor layers 324, the current crowding effect in silicide regions 330 is also reduced.

FIGS. 19 through 30 illustrate cross-sectional views of intermediate stages in the formation of FinFETs in accordance with alternative embodiments. Unless specified otherwise, the materials and the formation methods of the components in these embodiments are essentially the same as the like components, which are denoted by like reference numerals in the embodiments shown in FIGS. 1 through 10. The details regarding the formation processes and the materials of the components shown in FIGS. 19 through 30 may thus be found in the discussion of the embodiment shown in FIGS. 1 through 10.

Figure 19:
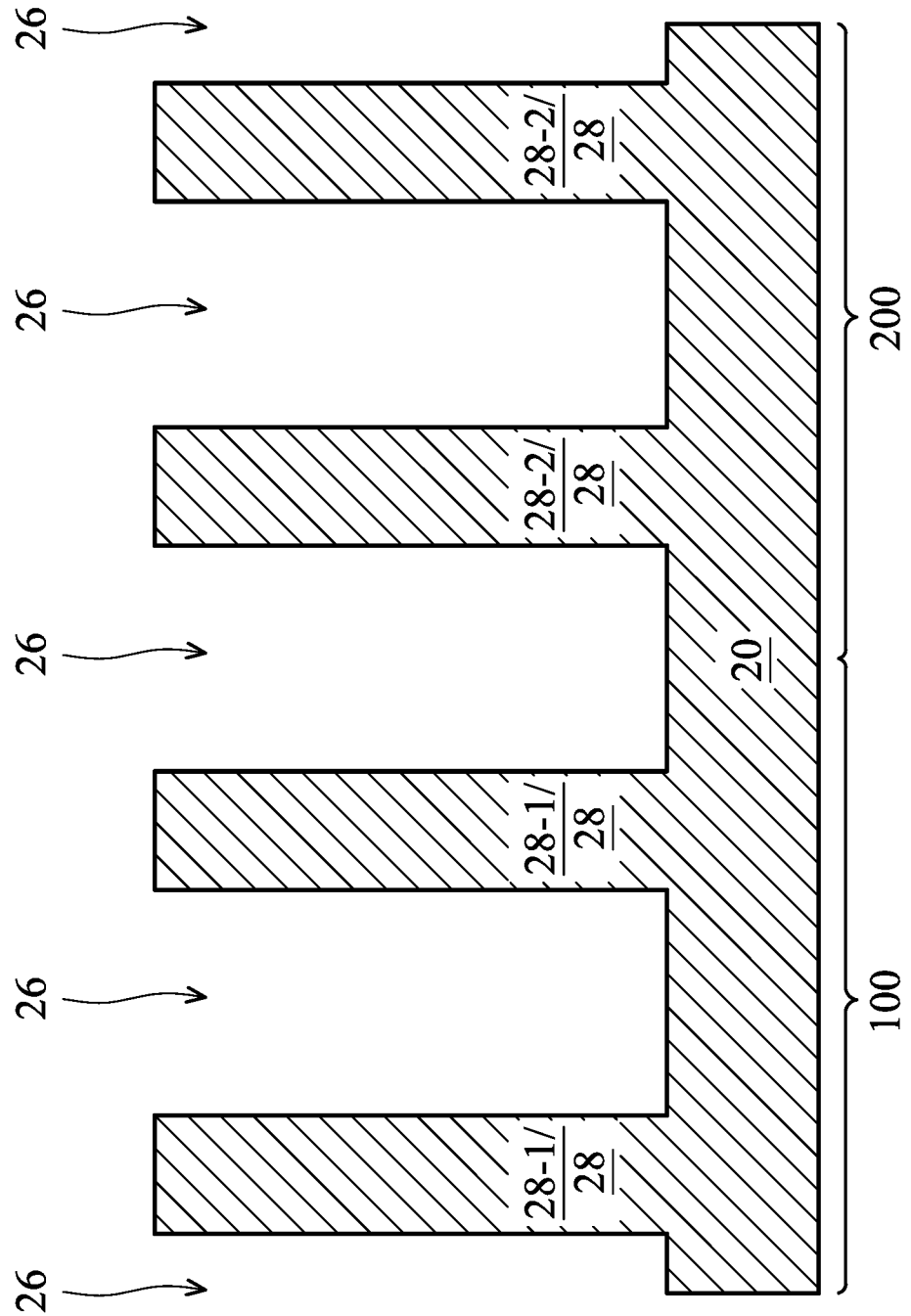
FIGS. 19 through 30 are cross-sectional views of intermediate stages in the manufacturing of FinFETs have different channel materials in accordance with some embodiments.

Referring to FIG. 19, semiconductor substrate 20 is provided. In some embodiments, semiconductor substrate 20 has a first bandgap Eg0. For example, when semiconductor substrate 20 is a silicon substrate, bandgap Eg0 is equal to about 1.12 eV. In alternative embodiments, semiconductor substrate 20 may be a silicon carbon substrate, a substrate germanium substrate, a III-V compound semiconductor substrate, or the like.

A portion of semiconductor substrate 20 is located in device region 100 and a portion in device region 200. In some embodiments, device region 100 is a p-type FinFET region, while device region 200 is an n-type FinFET region. In alternative embodiments, device region 100 is an n-type FinFET region, while device region 200 is a p-type FinFET region. In alternative embodiments, device regions 100 and 200 are different regions selected from the group consisting essentially of a logic core region, a memory region (such as an SRAM region), an analog region, an input/output (TO, also referred to as a peripheral) region, a dummy region (for forming dummy patterns), and the like. The above-referenced device regions are schematically illustrated in FIG. 17.

Semiconductor substrate 20 is etched to form trenches 26. Pad layer 22 and mask layer 24 (not shown, refer to FIG. 1) may also be formed before the etching of semiconductor substrate 20, wherein pad layer 22 and mask layer 24 are patterned using the same lithography process as the etching of semiconductor substrate 20. The etching of semiconductor substrate 20 may be performed using dry etch, so that the edges of trenches 26 are substantially straight. The remaining portions of semiconductor substrate 20 between trenches 26 are referred to as semiconductor strips 28 (including 28-1 and 28-2) hereinafter. Semiconductor strips 28 are formed from the same material as the underlying portion of semiconductor substrate 20. Throughout the description, the semiconductor strips 28 in device region 100 are referred to as semiconductor strips 28-1, and the semiconductor strips 28 in device region 200 are referred to as semiconductor strips 28-2.

Figure 20:
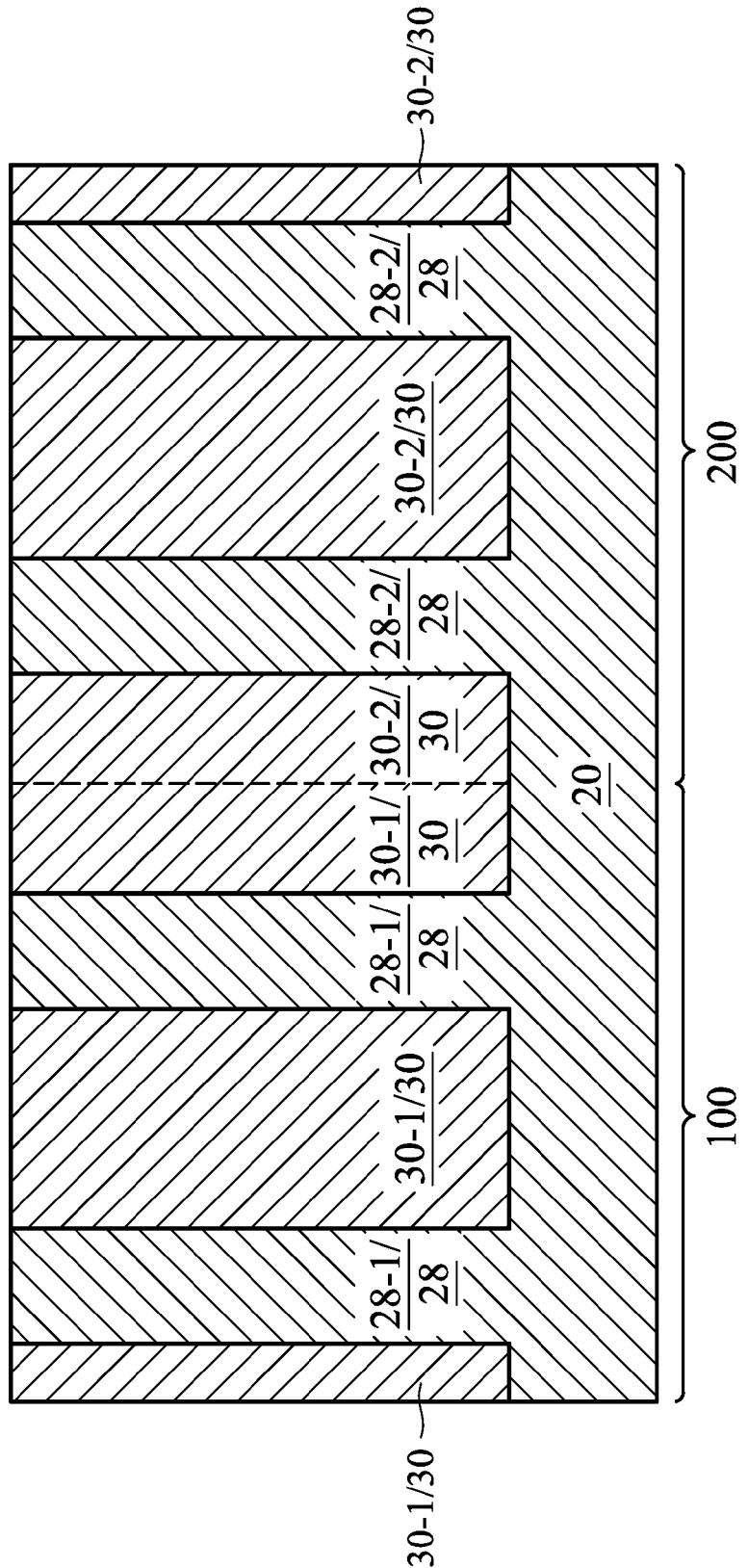

Referring to FIG. 20, isolation regions such as STI regions 30 (including portions 30-1 and 30-2) are formed in trenches 26 (FIG. 19). STI regions 30 may include, for example, silicon oxide, silicon nitride, or the like. The formation methods of STI regions 30 include Flowable CVD (FCVD), spin-coating, or the like.

Figure 21:
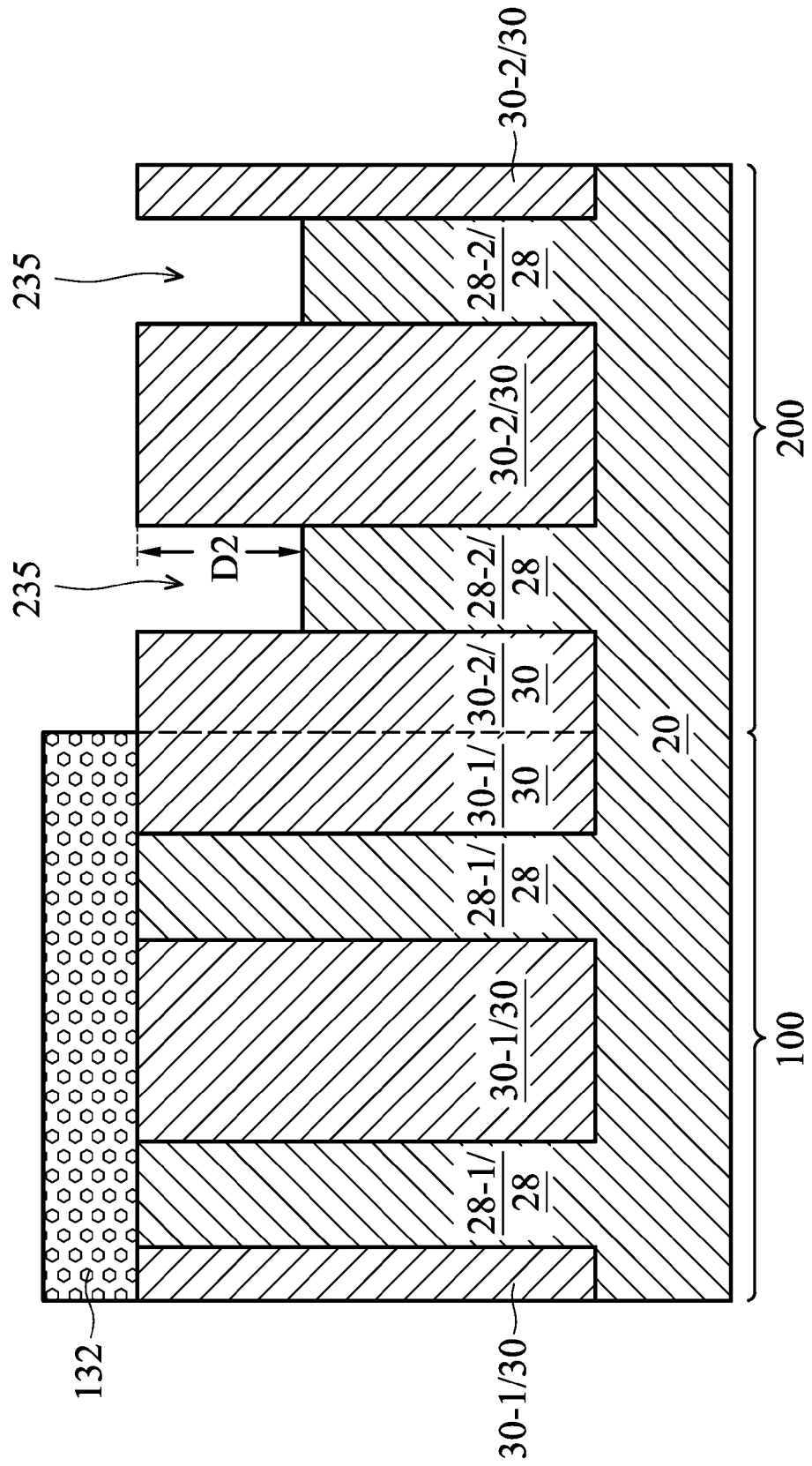
Figure 22:
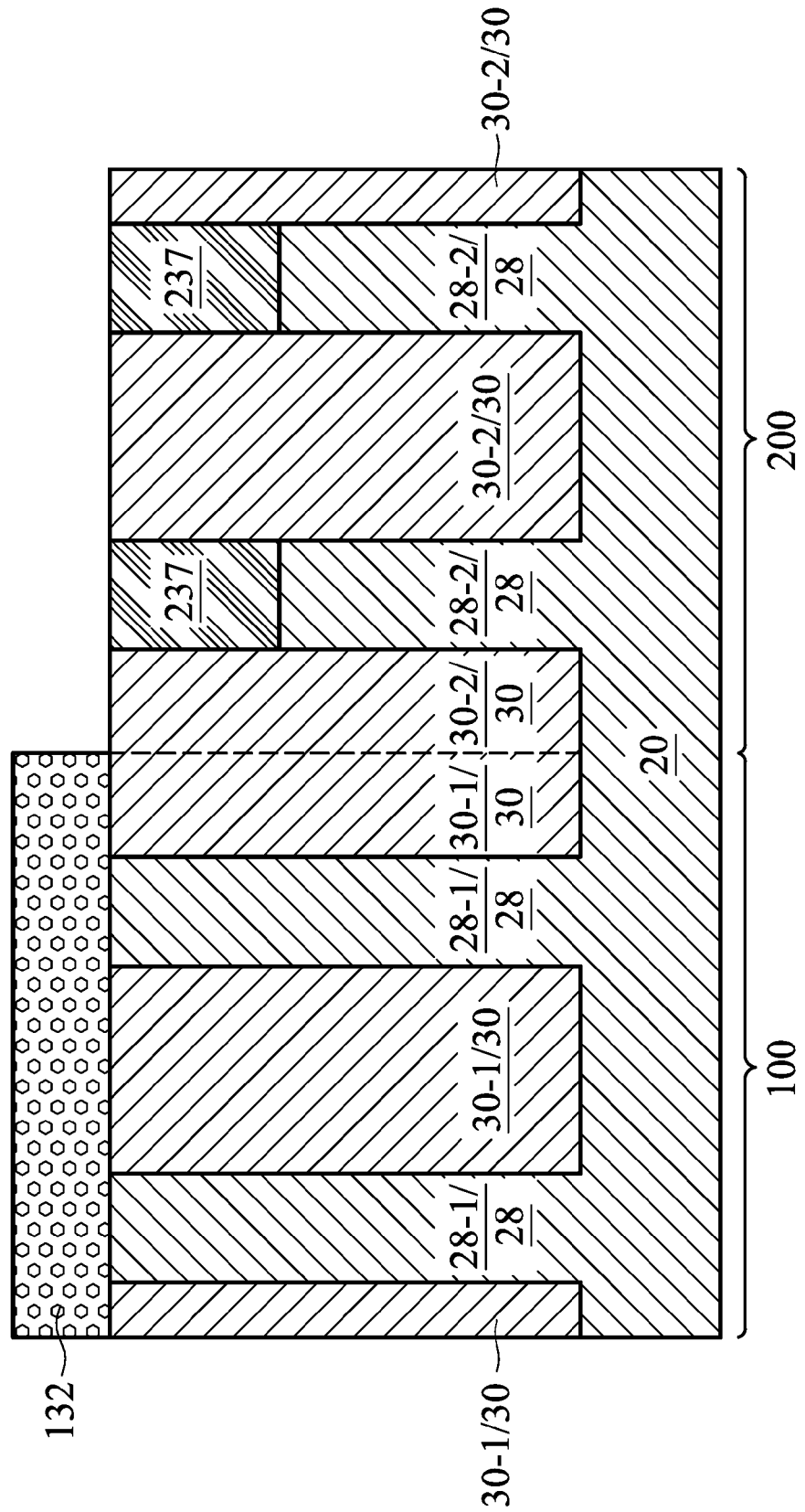

Referring to FIG. 21, device region 100 is masked by mask layer 132, leaving device region 200 exposed. In some embodiments, mask layer 132 comprises a photo resist. In alternative embodiments, mask layer 132 includes silicon oxide, silicon nitride, silicon carbide, or silicon oxynitride. Semiconductor strips 28-2 are then recessed through an etching step, resulting in recesses 235 in semiconductor substrate 20. The overlying pad layer and mask layer (not shown) are also removed. Recesses 235 have depth D2. In some embodiments, depth D2 is between about 10 nm and about 50 nm, although different depths may be used.

Mask layer 132 may then be removed. In the embodiments in which mask layer 132 includes a non-photo material such as silicon oxide or silicon nitride, mask layer 132 may remain in device region 100 in the subsequent epitaxy. Next, referring to FIG. 22, an epitaxy is performed to selectively grow epitaxy strips 237 in recesses 235 (FIG. 21). Semiconductor strips 28-2 are covered by a hard mask layer or mask layer 132 if it has not been removed yet, and hence no semiconductor material is grown in device region 100. Furthermore, even if mask layer 132 (FIG. 21) is removed during the epitaxy, the pad layer and the hard mask layer (not shown) will also prevent semiconductor materials from growing from semiconductor strips 28-1. In some embodiments, epitaxy strips 237 comprise a semiconductor material such as silicon carbon, silicon phosphorous, silicon germanium, or a III-V compound semiconductor material. The bandgap of epitaxy strips 237 is denoted as Eg2, which may be greater than, substantially equal to, or lower than, bandgap Eg0 of semiconductor strips 28 and semiconductor substrate 20.

Figure 23:
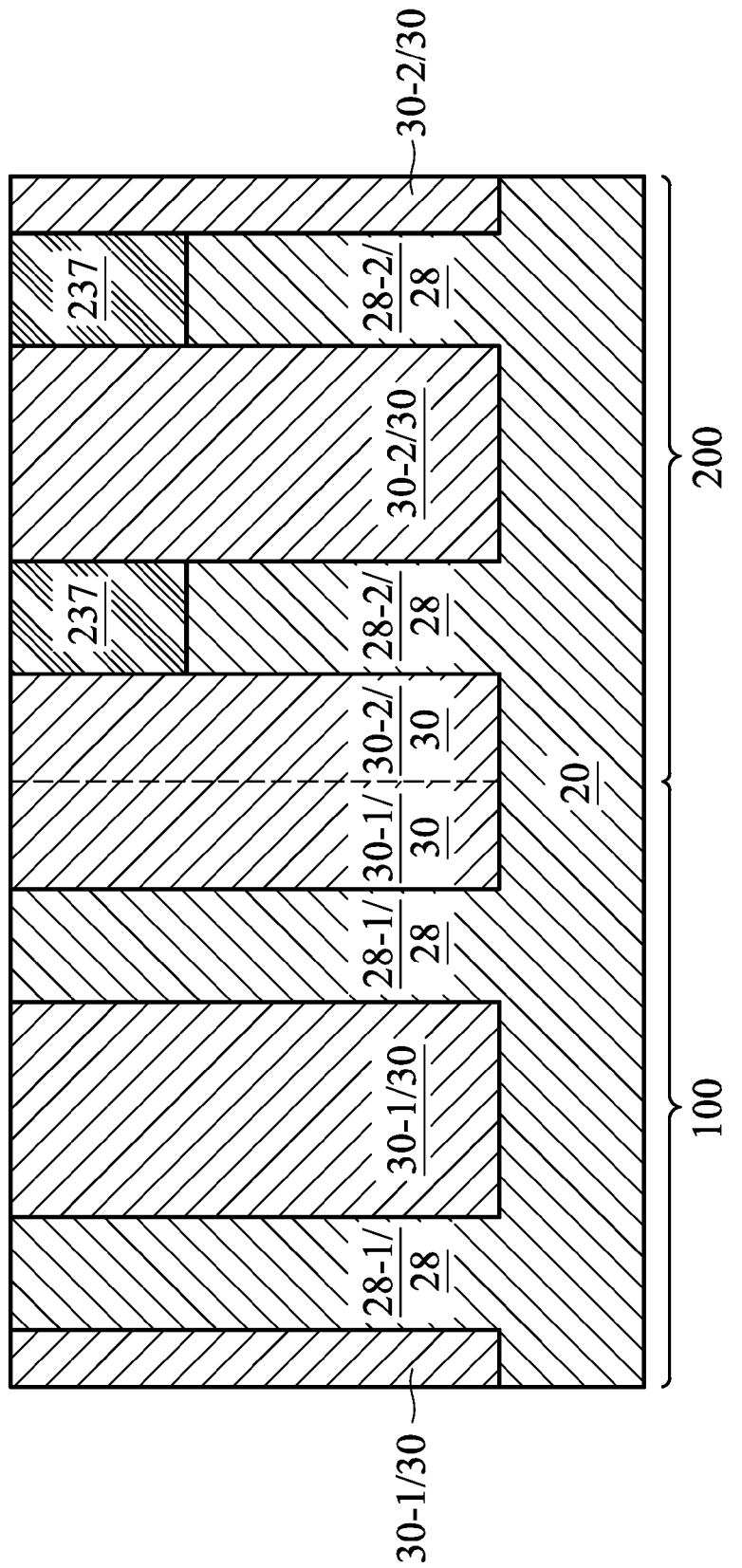

During the epitaxy, epitaxy strips 237 may be in-situ doped to form well regions for the subsequently formed FinFET 260 (FIGS. 30 and 32) in device region 200. For example, when FinFET device 260 is an n-type FinFET, epitaxy strips 237 is in-situ doped to p-type. Conversely, when FinFET device 260 is a p-type FinFET, epitaxy strips 237 is in-situ doped to n-type. After the epitaxy, a planarization such as a Chemical Mechanical Polish (CMP) is performed to level the top surface of epitaxy regions 237. For example, the top surfaces of epitaxy strips 237 may be coplanar with the top surfaces of hard masks (not shown, similar to hard mask 24 in FIG. 1). The resulting structure is shown in FIG. 23.

Figure 24:
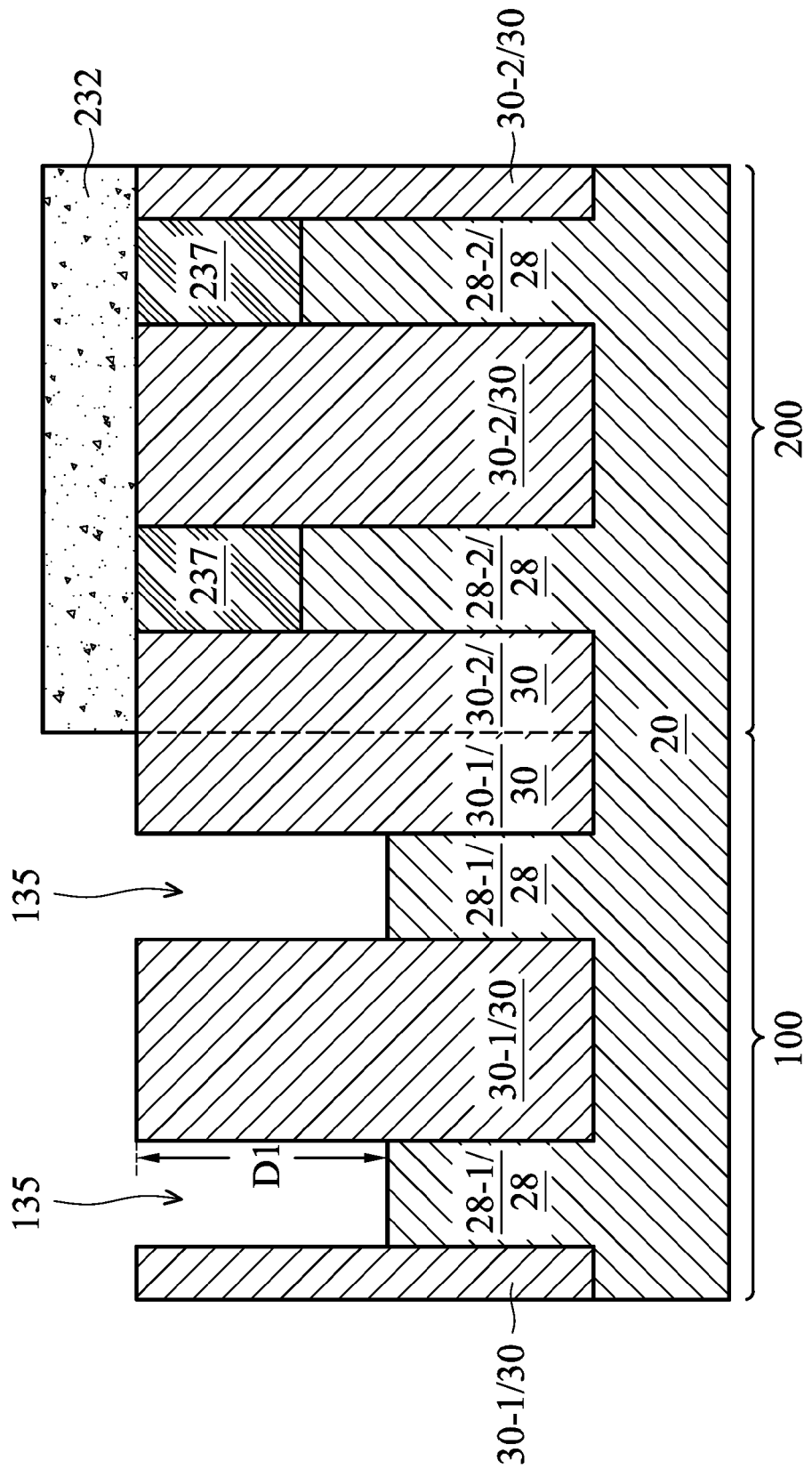

Referring to FIG. 24, device region 200 is masked by mask layer 232, leaving device region 100 exposed. In these embodiments, mask layer 232 may comprise silicon oxide, silicon nitride, silicon carbide, or silicon oxynitride, wherein mask layer 232 is configured to sustain the high temperatures used in the subsequent epitaxy. The exposed semiconductor strips 28-1 are then recessed through an etching step, resulting in recesses 135 in semiconductor substrate 20. Recesses 135 have depth D1. In some embodiments, depth D1 is between about 15 nm and about 80 nm, although different depths may be used. Furthermore, depth D1 is greater than D2. For example, the difference (D1−D2) may be greater than about 5 nm, greater than about 10 nm, or greater than about 15 nm or higher.

Figure 25:
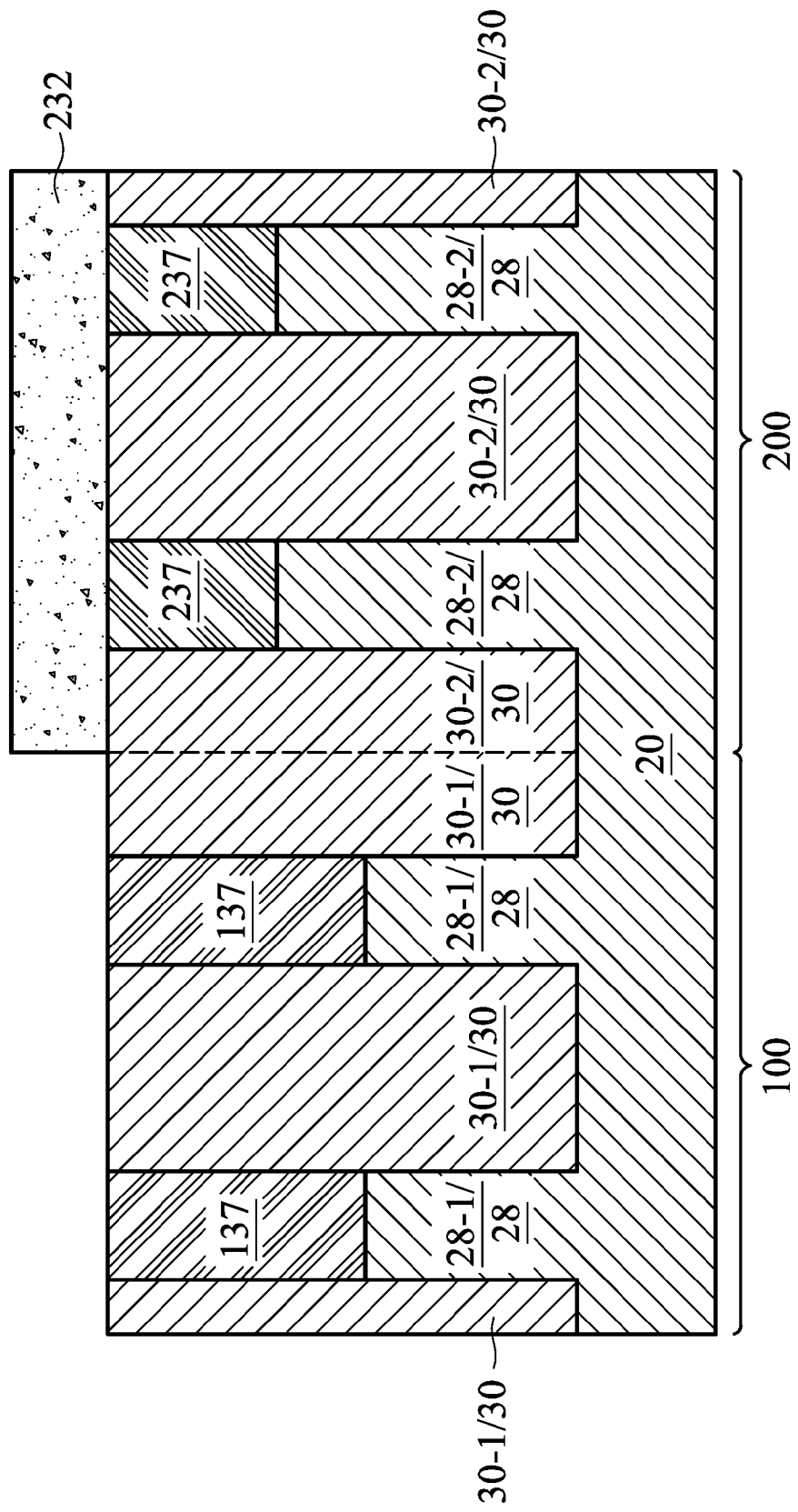

Next, as shown in FIG. 25, an epitaxy is performed to selectively grow epitaxy strips 137 in recesses 135. The epitaxy is performed with hard mask layer 232 covering device epitaxy strips 237 so that no semiconductor material is grown from epitaxy strips 28-2. In some embodiments, epitaxy strips 137 comprise a semiconductor material such as silicon carbon, silicon phosphorous, silicon germanium, or a III-V compound semiconductor material. The bandgap of epitaxy strips 137 is denoted as Eg1, which may be greater than, substantially equal to, or lower than, bandgap Eg0 of semiconductor strips 28-1 and semiconductor substrate 20. Furthermore, the material of epitaxy strips 137 may be different from or the same as the material of epitaxy strips 237. Accordingly, bandgaps Eg1 and Eg2 may be equal to or different from each other.

Figure 26:
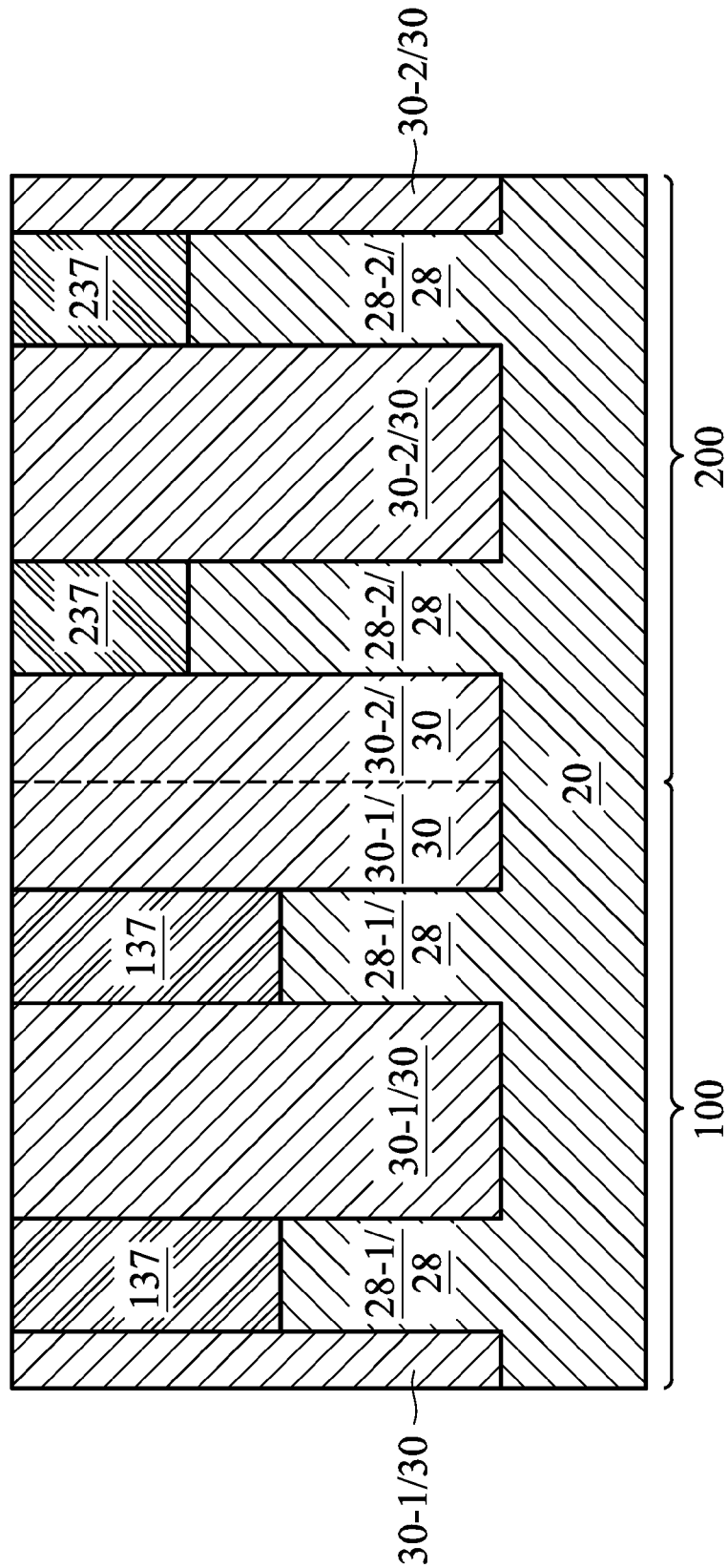

During the epitaxy, epitaxy strips 137 may be in-situ doped to form well regions for the subsequently formed FinFET 160 (FIGS. 30 and 32) in device region 100. For example, when FinFET device 160 is a p-type FinFET, epitaxy strips 237 is in-situ doped to n-type. Conversely, when FinFET device 160 is an n-type FinFET, epitaxy strips 237 is in-situ doped to p-type. After the epitaxy, hard mask layer 232 is removed. A planarization such as a CMP may be performed to level the top surface of the epitaxy strips 237. In the resulting structure, the top surfaces of epitaxy strips 137 are coplanar with the top surfaces of epitaxy strips 237 and STI regions 30. The resulting structure is shown in FIG. 26.

Figure 27:
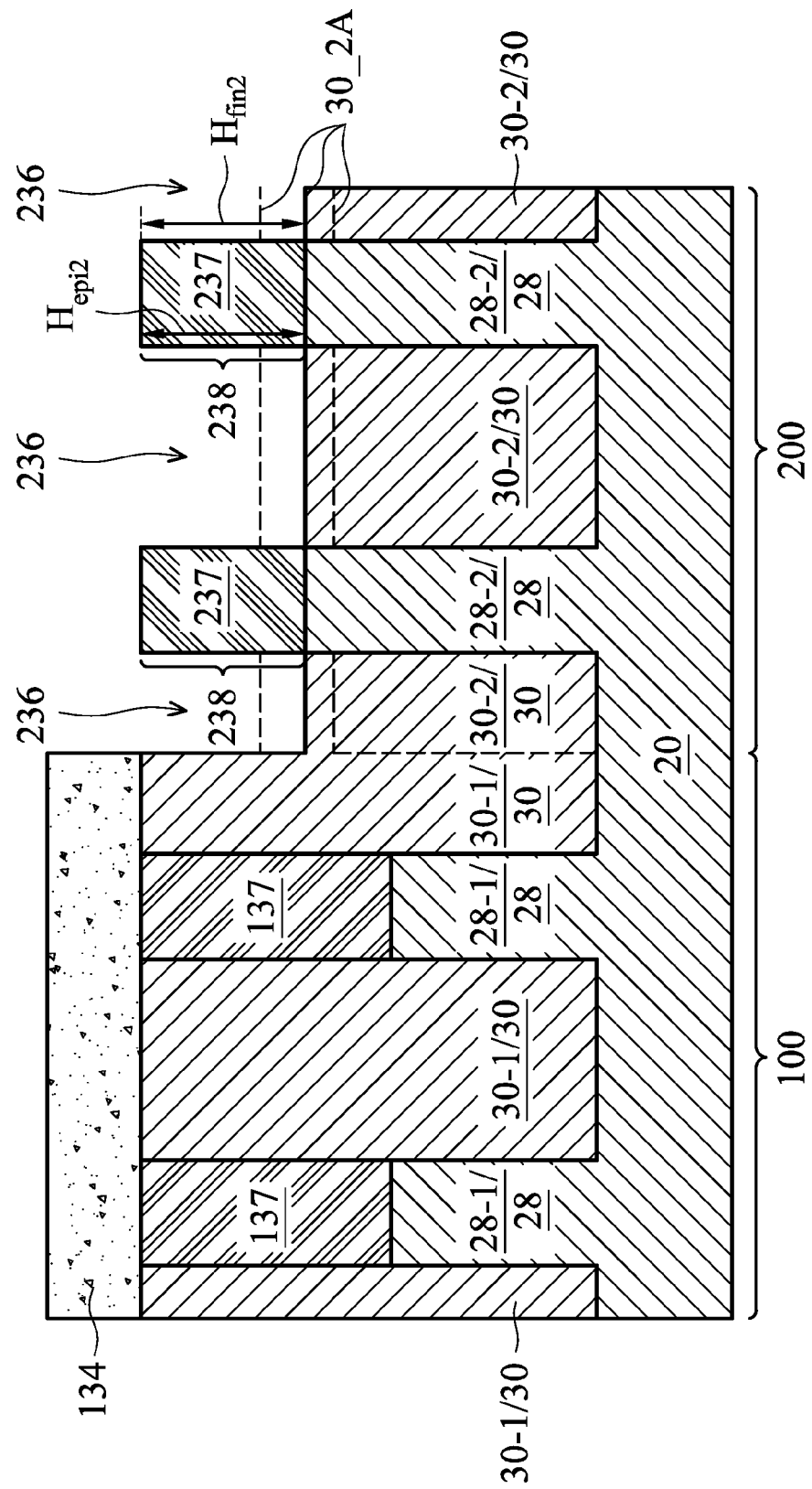

Referring to FIG. 27, device region 100 is masked by photo resist 134, leaving device region 200 exposed. The exposed STI regions 30-2 are then recessed through etching, resulting in recesses 236 in device region 200. The etching may be performed using a dry etching or a wet etching, wherein an etchant that attacks STI regions 30-2 and does not attack epitaxy strips 237 and semiconductor strips 28-2 is used. As a result, at least the top portions of epitaxy strips 237 are over the top surfaces 30-2A of remaining STI regions 30-2. The portions of epitaxy strips 237 and semiconductor strips 28-2 over the top surfaces of the remaining STI regions 30-2 are referred to as semiconductor fins 238. Semiconductor fins 238 have a fin height denoted as Hfin2. In some exemplary embodiments, fin height Hfin2 is between about 10 nm and about 60 nm. Photo resist 134 is then removed.

Depending on the recessing depth, the top surfaces 30-2A of STI regions 30-2 may be at different levels. For example, as shown in FIG. 27, top surfaces 30-2A may be level with the bottom surfaces of epitaxy strips 237. Alternatively stated, fin height Hfin2 is equal to height Hepi2 of epitaxy strips 237 in these embodiments. In other embodiments, for example, when the bandgap Eg2 of epitaxy strips 237 is higher than or equal to bandgap Eg0 of semiconductor strips 28-2, the top surfaces 30-2A (dashed lines) of STI regions 30-2 are higher than the bottom surfaces of epitaxy strips 237. In yet other embodiments, for example, when the bandgap Eg2 of epitaxy strips 237 is lower than or equal to bandgap Eg0 of semiconductor strips 28-2, top surfaces 30-2A (dashed lines) of STI regions 30-2 are lower than the bottom surfaces of epitaxy strips 237. The respective top surfaces 30-2A of STI regions 30-2 are illustrated using dashed lines.

Figure 28:
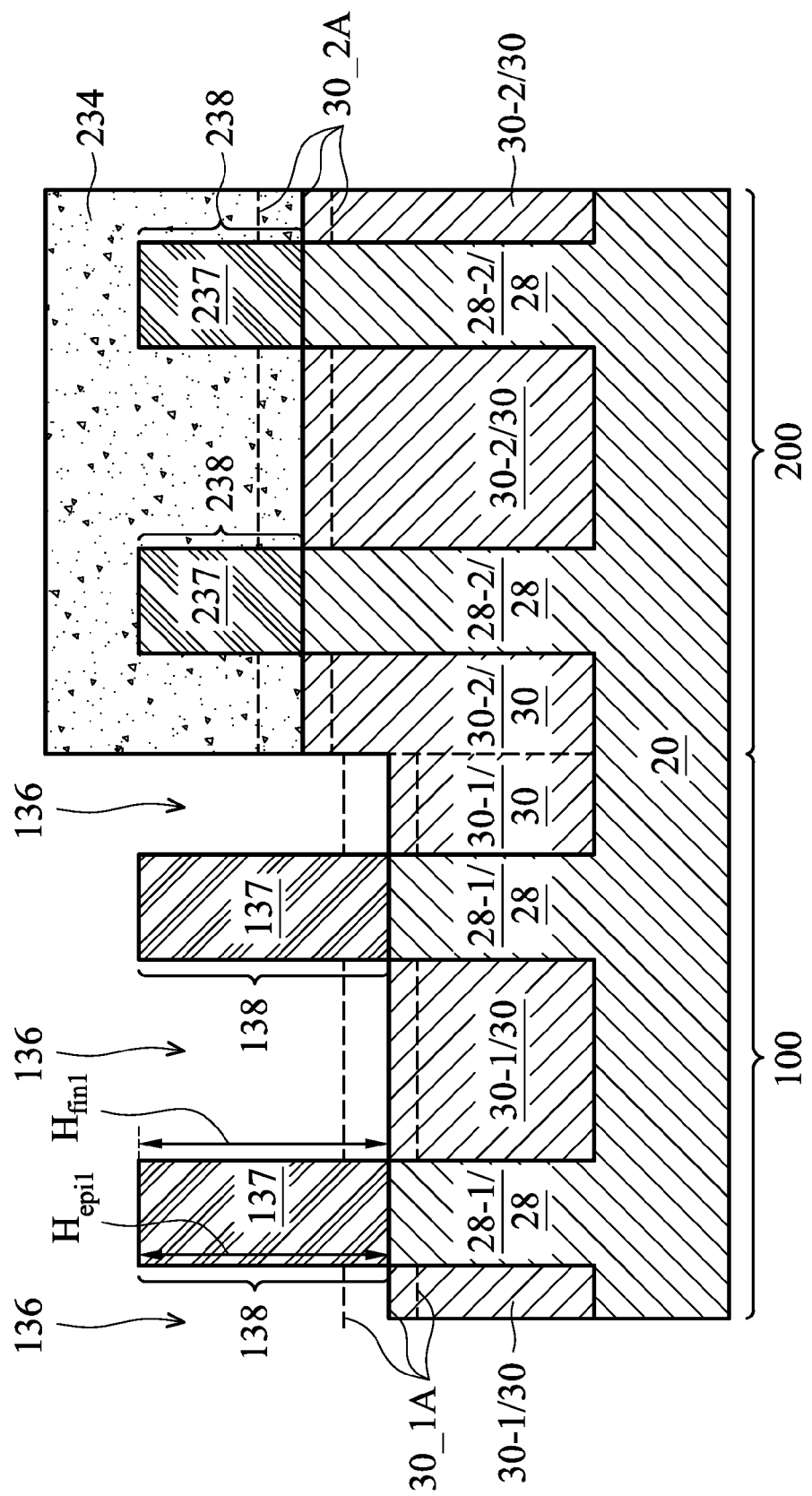

Referring to FIG. 28, device region 200 is masked by photo resist 234, leaving device region 100 exposed. The exposed STI regions 30-1 are then recessed through etching, resulting in recesses 136. The portions of semiconductor substrate 20 between recesses 136 thus become fins 138, which have a fin height denoted as Hfin1. In some exemplary embodiments, fin height Hfin1 is between about 10 nm and about 85 nm, although it may also be greater or smaller. Fin heights Hfin1 and Hfin2 are different from each other. The fin height difference (Hfin2−Hfin1) may be greater than about 5 nm or greater than about 10 nm. Further, a ratio of Hfin1/Hfin2 may be greater than about 1.25 or greater than about 1.33. After the recessing of STI regions 30-1, photo resist 234 is removed, leaving the structure shown in FIG. 29.

Figure 29:
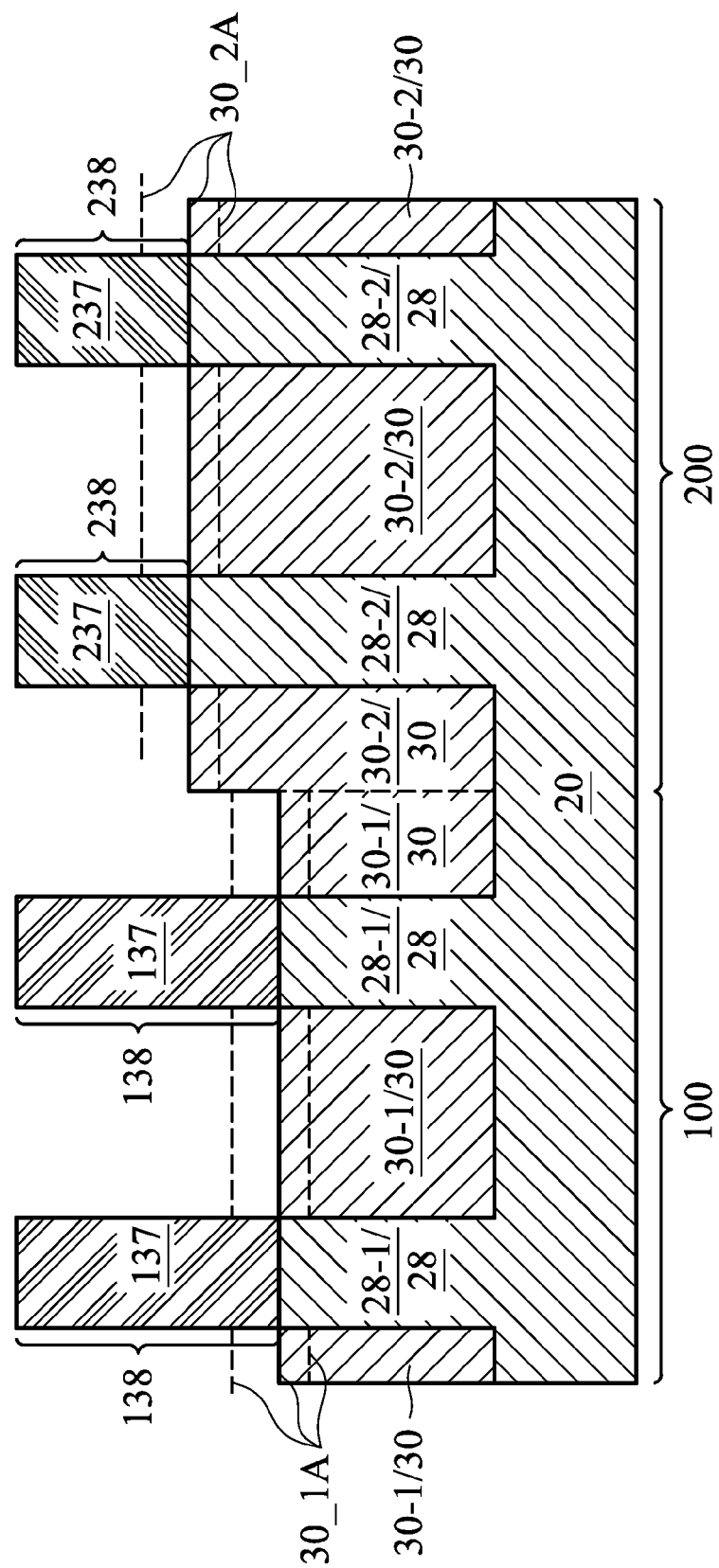

Depending on the recessing depth, the top surfaces 30-1A of semiconductor fins 138 may be at different levels. For example, as shown in FIG. 29, top surfaces 30-1A may be level with the bottom surfaces of epitaxy strips 137. Alternatively stated, fin height Hfin1 is equal to the height Hepi1 of epitaxy strips 137 in these embodiments. In other embodiments, for example, when bandgap Eg1 of epitaxy strips 137 is higher than or equal to bandgap Eg0 of semiconductor strips 28-1, top surfaces 30-1A of STI regions 30-1 are higher than the bottom surfaces of epitaxy strips 137. In yet other embodiments, for example, when the bandgap Eg1 of epitaxy strips 137 is lower than or equal to bandgap Eg0 of semiconductor strips 28-1, top surfaces 30-1A of STI regions 30-1 are lower than the bottom surfaces of epitaxy strips 137. The respective top surfaces 30-1A of STI regions 30-1 are illustrated using dashed lines.

Figure 30:
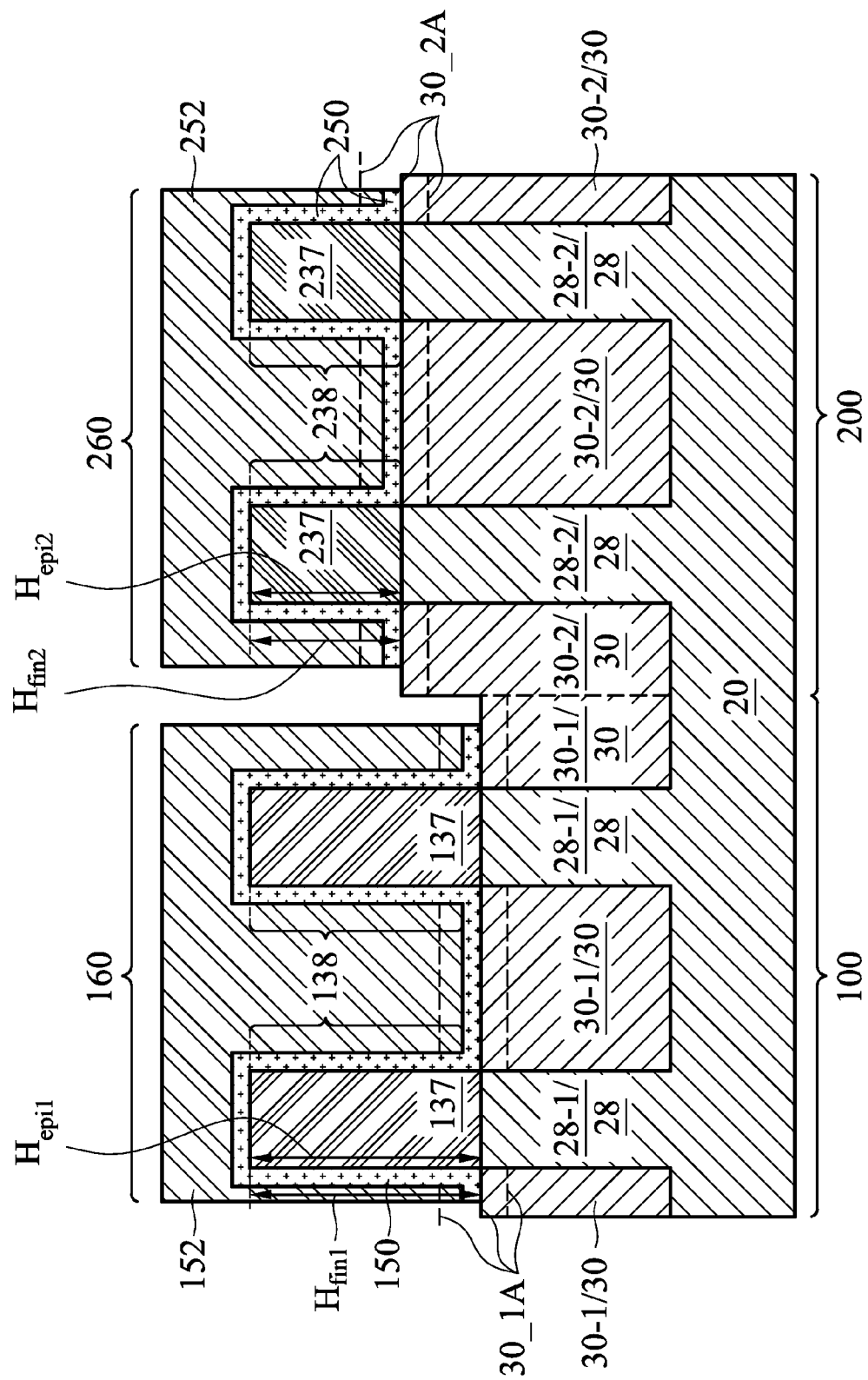

FIG. 30 illustrates the formation of FinFETs 160 and 260 in device regions 100 and 200, respectively. In some embodiments, well dopants are introduced into the exposed fins 138 and 238 by, for example, implantations. In alternative embodiments, the well dopants have been introduced in the epitaxy of epitaxy strips 137 and 237, and hence no well implantation is performed. Gate dielectrics 150 and 250 are formed to cover the top surfaces and the sidewalls of fins 138 and 238, respectively. Gate dielectrics 150 and 250 may be formed by a deposition step such as CVD, a thermal oxidation, or the like. Gate electrodes 152 and 252 are formed over gate dielectrics 150 and 250, respectively. In some embodiments, each of gate electrodes 152 and 252 covers more than one of fins 138 and 238 so that each of the resulting FinFETs 160 and 260 comprises more than one fin 138 and 238, respectively. In alternative embodiments, each of fins 138 and/or 238 is used to form one FinFET. The remaining components of FinFETs 160 and 260, including source and drain regions and source and drain silicides (not shown), are then formed. The formation processes are not discussed in detail herein.

As shown in FIG. 30, FinFETs 160 and 260 have different fin heights Hfin1 and Hfin2, which are achieved by adjusting the epitaxy of epitaxy strips 137 and 237 and the recessing of STI regions 30-1 and 30-2. The drive currents of FinFETs 160 and 260 thus can be adjusted to desirable levels. For example, PMOS devices may need to have a stronger boost to their drive currents than NMOS devices. Hence, fin height Hfin1 is configured to be greater than fin height Hfin2 when FinFET 160 is a p-type FinFET and FinFET 260 is an n-type FinFET.

In addition, the drive currents of FinFETs 160 and 260 may also be adjusted by selecting appropriate semiconductor materials for FinFETs 160 and 260. For example, by selecting appropriate semiconductor materials for epitaxy strips 137 and 237 to have lower bandgaps Eg1 and Eg2, respectively, the drive currents of FinFETs 160 and 260 are increased. The desirable top surface level of STI regions 30 may also be related to the bandgaps of epitaxy strips 137 and 237. For example, in the embodiments in which bandgap Eg1 of epitaxy strips 137 is higher than bandgap Eg0 of the underlying semiconductor strips 28-1, epitaxy height Hepi1 may be greater than fin height Hfin1 so that the bottom portions of epitaxy strips 137 are lower than top surfaces 30-1A of STI regions 30-1. The portions of semiconductor material immediately underlying the channel of FinFET 160 affect the leakage current of FinFET 160. With these portions being parts of epitaxy strips 137 that have a higher bandgap, the leakage current is reduced. Conversely, in the embodiments in which bandgap Eg1 of epitaxy strips 137 is lower than bandgap Eg0 of the underlying semiconductor strips 28-1, epitaxy height Hepi2 may be smaller than fin height Hfin1 so that the top portions of semiconductor strips 28-1 are higher than top surfaces 30-1A of STI regions 30-1. This may also cause the reduction in the leakage current of FinFET 160. For FinFET 260, the top surface level of STI regions 30-2 may also be configured similarly to FinFET 160 to reduce the leakage current.

Figure 31:
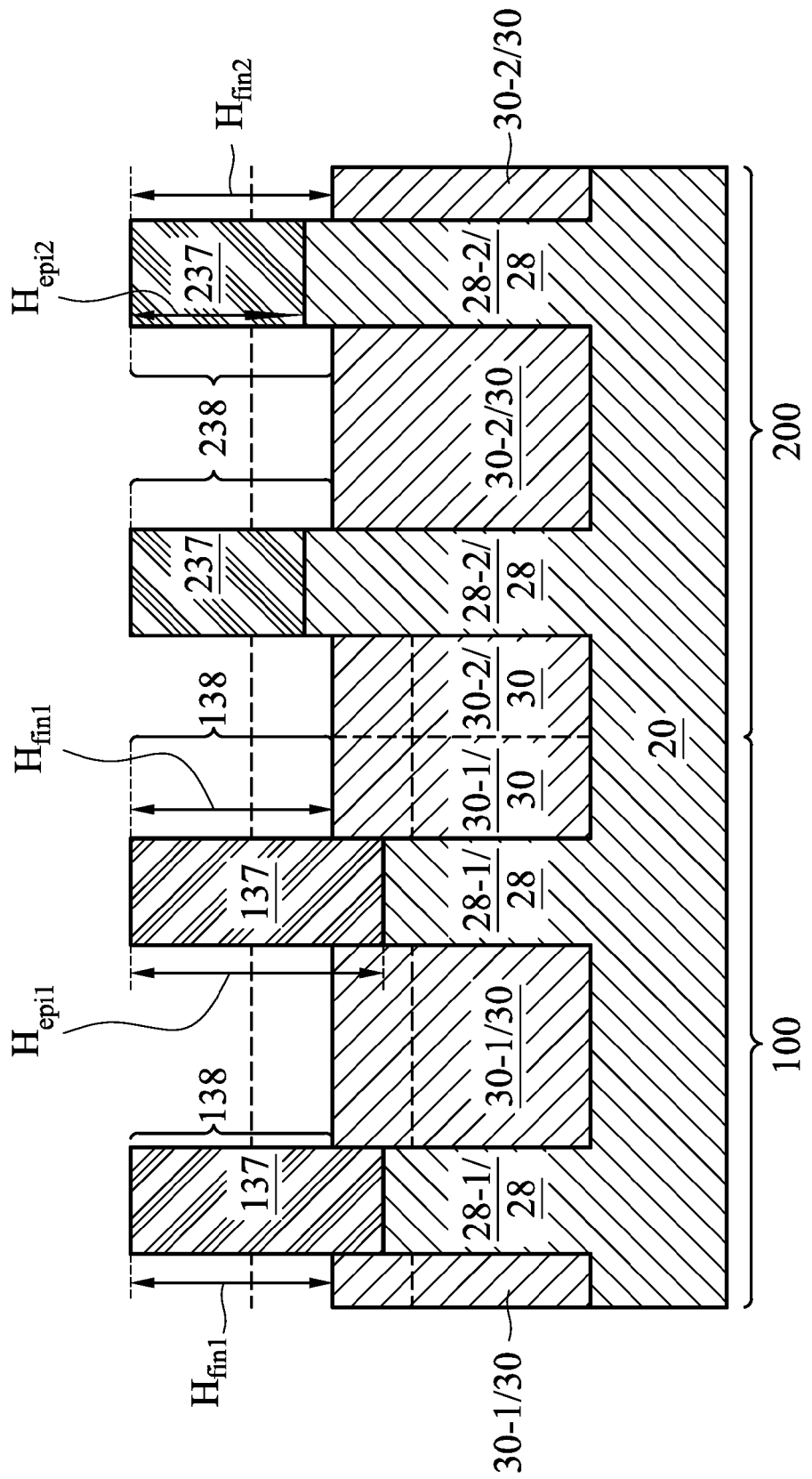
FIGS. 31 and 32 are cross-sectional views of intermediate stages in the manufacturing of FinFETs have different channel materials in accordance with some alternative embodiments.
Figure 32:
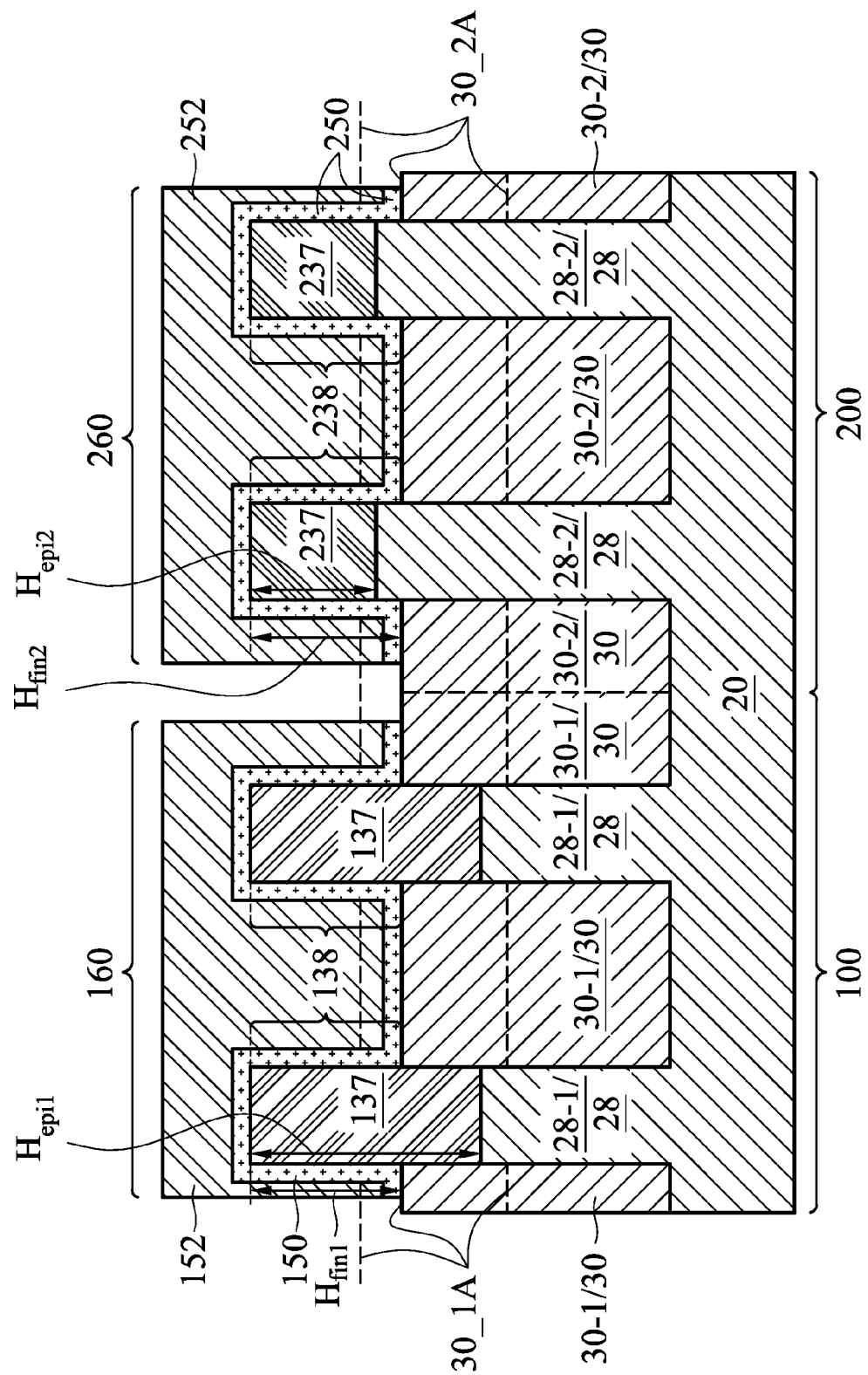

FIGS. 31 and 32 illustrate the intermediate stages in the formation of FinFETs 160 and 260 in accordance with alternative embodiments of the present disclosure. These embodiments differ from the embodiments in FIGS. 19 through 30 in that the top surfaces of STI regions 30-1 and 30_2 are level with each other. The initial steps for forming the structure in FIG. 31 include the steps in FIGS. 19 through 26. Next, referring to FIG. 31, STI regions 30-1 and 30-2 are recessed simultaneously. Hence, fin heights $H_{fin1}$ and $H_{fin2}$ are equal to each other. Next, as shown in FIG. 32, gate dielectrics 150 and 250 and gate electrodes 152 and 252 are formed, followed by the formation of source and drain regions (not shown) to finish the formation of FinFETs 160 and 260.

In accordance with some embodiments, the bandgap Eg1 of epitaxy strips 137 is greater than the bandgap Eg0 of the underlying semiconductor strips 28-1, and the bandgap Eg2 of epitaxy strips 237 is smaller than the bandgap Eg0 of the underlying semiconductor strips 28-2. Accordingly, the top surfaces 30-1A of STI regions 30-1 and the top surface 30-2A of STI regions 30-2 are higher than the bottom surfaces of epitaxy strips 137 and lower than the bottom surfaces of epitaxy strips 237 so that the leakage currents of both FinFETs 160 and 260 are reduced. In accordance with alternative embodiments, bandgap Eg1 of epitaxy strips 137 and bandgap Eg2 of epitaxy strips 237 are both greater than the bandgap Eg0 of the underlying semiconductor strips 28. Accordingly, top surfaces 30-1A and 30-2A (illustrated using dashed lines) are higher than the bottom surfaces of both epitaxy strips 137 and epitaxy strips 237 so that the leakage currents of both FinFETs 160 and 260 are reduced. In accordance with alternative embodiments, the bandgaps Eg1 of epitaxy strips 137 and the bandgap Eg2 of epitaxy strips 237 are both smaller than the bandgap Eg0 of the underlying semiconductor strips 28. Accordingly, top surfaces 30-1A and 30-2A (illustrated using dashed lines) are lower than the bottom surfaces of both epitaxy strips 137 and epitaxy strips 237 so that the leakage currents of both FinFETs 160 and 260 are reduced.

The embodiments of the present disclosure have some advantageous features. With the epitaxy heights and the fin heights of two FinFETs adjusted in the epitaxy and STI recessing, the drive currents of two FinFETs can be adjusted to desirable levels, and the leakage currents of the FinFETs may both be reduced.

In accordance with some embodiments of the present disclosure, an integrated circuit structure includes a first semiconductor strip, first isolation regions on opposite sides of the first semiconductor strip, and a first epitaxy strip overlapping the first semiconductor strip. A top portion of the first epitaxy strip is over a first top surface of the first isolation regions. The structure further includes a second semiconductor strip, wherein the first and the second semiconductor strips are formed of the same semiconductor material. Second isolation regions are on opposite sides of the second semiconductor strip. A second epitaxy strip overlaps the second semiconductor strip. A top portion of the second epitaxy strip is over a second top surface of the second isolation regions. The first epitaxy strip and the second epitaxy strip are formed of different semiconductor materials. A bottom surface of the first epitaxy strip is lower than a bottom surface of the second epitaxy strip.

In accordance with alternative embodiments of the present disclosure, an integrated circuit structure includes a first semiconductor strip, and first isolation regions on opposite sides of the first semiconductor strip. The first isolation regions have first top surfaces. A first epitaxy strip overlaps the first semiconductor strip, wherein a top portion of the first epitaxy strip is over the first top surfaces of the first isolation regions. The integrated circuit structure further includes a second semiconductor strip, wherein the first semiconductor strip and the second semiconductor strip are formed of a same semiconductor material. Second isolation regions are on opposite sides of the second semiconductor strip, wherein the second isolation regions have second top surfaces higher than the first top surfaces. A second epitaxy strip overlaps the second semiconductor strip. A top portion of the second epitaxy strip is over the second top surfaces of the second isolation regions.

In accordance with yet alternative embodiments of the present disclosure, a method includes forming a first and a second plurality of STI regions in a semiconductor substrate. A first portion of the semiconductor substrate between the first plurality of STI regions is configured as a first semiconductor strip, and a second portion of the semiconductor between the second plurality of STI regions is configured as a second semiconductor strip. The method further includes recessing the first semiconductor strip to form a first recess having a first depth, performing a first epitaxy to grow a first epitaxy strip in the first recess, recessing the second semiconductor strip to form a second recess having a second depth different from the first depth, and performing a second epitaxy to grow a second epitaxy strip in the second recess. The first plurality of STI regions and the plurality of STI regions are recessed to form a first semiconductor fin and a second semiconductor fin. The first semiconductor fin has a top portion of the first epitaxy strip, and the second semiconductor fin has a top portion of the second epitaxy strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first recess between two portions of a first plurality of shallow trench isolation (STI) regions;
    performing a first epitaxy to grow a first epitaxy strip in the first recess, wherein the first epitaxy strip is over and contacting a first semiconductor strip portion of a semiconductor substrate;
    forming a second recess between additional two portions of a second plurality of STI regions;
    performing a second epitaxy to grow a second epitaxy strip in the second recess, wherein the first epitaxy strip is over and contacting a second semiconductor strip portion of the semiconductor substrate; and
    recessing the first plurality of STI regions and the second plurality of STI regions to form a first semiconductor fin and a second semiconductor fin, respectively, wherein the first plurality of STI regions is recessed to a first depth smaller than a height of the first epitaxy strip, and the second plurality of STI regions is recessed to a second depth greater than a height of the second epitaxy strip.

2. The method of claim 1, wherein the recessing the first plurality of STI regions and the second plurality of STI regions comprises etching the first plurality of STI regions and the second plurality of STI regions in different etching processes.

3. The method of claim 1, wherein the first plurality of STI regions and the second plurality of STI regions are recessed to different depths.

4. The method of claim 1, wherein the first recess and the second recess have different depths.

5. The method of claim 1, wherein the recessing the first plurality of STI regions and the second plurality of STI regions comprises:
    recessing the first plurality of STI regions, with top surfaces of remaining portions of the first plurality of STI regions being higher than a bottom surface of the first epitaxy strip; and
    recessing the second plurality of STI regions, with top surfaces of remaining portions of the second plurality of STI regions being lower than a bottom surface of the second epitaxy strip.

6. The method of claim 5, wherein the first epitaxy strip has a first bandgap higher than a bandgap of the semiconductor substrate, and the second epitaxy strip has a second bandgap lower than the bandgap of the semiconductor substrate.

7. The method of claim 5 further comprising:
    forming a first gate dielectric and a first gate electrode in contact with a top surface and sidewalls of the first semiconductor fin; and
    forming a second gate dielectric and a second gate electrode in contact with a top surface and sidewalls of the second semiconductor fin.

8. The method of claim 1 further comprising performing planarization steps to level a top surface of the first epitaxy strip with a top surface of the second epitaxy strip.

9. A method comprising:
forming a first and a second plurality of shallow trench isolation (STI) regions in a semiconductor substrate, wherein a first portion of the semiconductor substrate between the first plurality of STI regions is configured as a first semiconductor strip, and a second portion of the semiconductor substrate between the second plurality of STI regions is configured as a second semiconductor strip, wherein the semiconductor substrate has a first bandgap;
recessing the first semiconductor strip to form a first recess having a first depth;
performing a first epitaxy to grow a first epitaxy strip in the first recess, with the first epitaxy strip having a second bandgap greater than the first bandgap;
recessing the second semiconductor strip to form a second recess shallower than the first recess;
performing a second epitaxy to grow a second epitaxy strip in the second recess, with the second epitaxy strip having a third bandgap smaller than the first bandgap;
recessing the first plurality of STI regions, with top surfaces of remaining portions of the first plurality of STI regions being higher than a bottom surface of the first epitaxy strip; and
recessing the second plurality of STI regions, with top surfaces of remaining portions of the second plurality of STI regions being lower than a bottom surface of the second epitaxy strip.

10. The method of claim 9, wherein a top portion of the first epitaxy strip protrudes higher than the first plurality of STI regions to form a first semiconductor fin, and the second epitaxy strip and a top portion of the second semiconductor strip protrude higher than the second plurality of STI regions to form a second semiconductor fin, and the method further comprises:
forming a first gate dielectric and a first gate electrode in contact with a top surface and a sidewall of the first semiconductor fin; and
forming a second gate dielectric and a second gate electrode in contact with a top surface and a sidewall of the second semiconductor fin.

11. The method of claim 9, wherein the recessing the first plurality of STI regions and the recessing the second plurality of STI regions are performed in different etching processes, and the first plurality of STI regions and the second plurality of STI regions are recessed to different depths.

12. The method of claim 9, wherein the top surfaces of remaining portions of the first plurality of STI regions are higher than the top surfaces of remaining portions of the second plurality of STI regions.

13. The method of claim 9, wherein the recessing the first plurality of STI regions and the second plurality of STI regions comprises etching the first plurality of STI regions and the second plurality of STI regions in different etching processes.

14. The method of claim 9, wherein the recessing the first plurality of STI regions and the second plurality of STI regions comprises etching the first plurality of STI regions and the second plurality of STI regions simultaneously.

15. The method of claim 9 further comprising performing planarization steps to level a top surface of the first epitaxy strip with a top surface of the second epitaxy strip.

16. A method comprising:
forming a first and a second plurality of shallow trench isolation (STI) regions in a semiconductor substrate;
recessing a portion of a first semiconductor strip between the first plurality of STI regions to form a first recess having a first depth;
performing a first epitaxy to grow a first epitaxy strip in the first recess;
recessing a portion of a second semiconductor strip between the second plurality of STI regions to form a second recess having a second depth;
performing a second epitaxy to grow a second epitaxy strip in the second recess;
recessing the first plurality of STI regions and the second plurality of STI regions;
forming a first gate stack in contact with the first epitaxy strip, wherein the first gate stack is not in contact with the first semiconductor strip; and
forming a second gate stack in contact with both the second epitaxy strip and the second semiconductor strip.

17. The method of claim 16, wherein the first epitaxy strip has a first bandgap greater than a bandgap of the first semiconductor strip, and the second epitaxy strip has a second bandgap smaller than a bandgap of the second semiconductor strip.

18. The method of claim 16, wherein after the first plurality of STI regions and the second plurality of STI regions are recessed, first top surfaces of remaining portions of the first plurality of STI regions are higher than or level with a bottom surface of the first epitaxy strip, and second top surfaces of remaining portions of the second plurality of STI regions are lower than or level with a bottom surface of the second epitaxy strip.

19. The method of claim 16 further comprising performing planarization steps to level a top surface of the first epitaxy strip with a top surface of the second epitaxy strip.

20. The method of claim 16, wherein the first epitaxy strip and the second epitaxy strip are formed of different materials.

* * * * *